United States Patent [19]
Aoai et al.

[11] Patent Number: 5,945,250
[45] Date of Patent: Aug. 31, 1999

[54] POSITIVE PHOTOSENSITIVE COMPOSITION

[75] Inventors: Toshiaki Aoai; Kenichiro Sato; Kunihiko Kodama, all of Shizuoka, Japan

[73] Assignee: Fuji Photo Film Co., Ltd., Kanagawa, Japan

[21] Appl. No.: 08/868,932

[22] Filed: Jun. 4, 1997

[30] Foreign Application Priority Data

Jun. 4, 1996 [JP] Japan ................................. 8-141965

[51] Int. Cl.$^6$ .............................. B03C 1/492; C08F 2/46
[52] U.S. Cl. ................. 430/270.1; 430/906; 430/914; 430/917; 430/919; 430/921; 522/31
[58] Field of Search ................................. 430/270.1, 906, 430/914, 917, 919, 921; 522/31; 525/919

[56] References Cited

U.S. PATENT DOCUMENTS

| | | | |
|---|---|---|---|
| 4,650,734 | 3/1987 | Molaire et al. | 430/7 |
| 5,310,619 | 5/1994 | Crivello et al. | 430/270 |
| 5,346,803 | 9/1994 | Crivello et al. | 430/270 |
| 5,550,004 | 8/1996 | Honda | 430/270.1 |

OTHER PUBLICATIONS

Lamola, A.A., et al, Chemically Amplified Resists, Solid State Technology, Aug. 1991, pp. 53–60.

*Primary Examiner*—Janet Baxter
*Assistant Examiner*—Rosemary Ashton
*Attorney, Agent, or Firm*—Sughrue, Mion, Zinn, Macpeak & Seas, PLLC

[57] ABSTRACT

A photosensitive composition containing a sulfonium or iodonium salt resin having a specific repeating structural units has good solubility in solvents and high photosensitivity, are capable of giving an excellent resist pattern, and change little with time after exposure.

12 Claims, No Drawings

POSITIVE PHOTOSENSITIVE COMPOSITION

FIELD OF THE INVENTION

The present invention relates to photosensitive compositions for use in the production of lithographic printing plates and semiconductors, e.g., integrated circuits, and the production of circuit boards for liquid crystals, thermal heads, etc., and in other photofabrication processes.

BACKGROUND OF THE INVENTION

Positive photoresist compositions in use generally comprise an alkali-soluble resin and a naphthoquinonediazide compound as a photosensitive substance. For example, photoresist compositions comprising "a combination of a phenolic novolak resin and a naphthoquinonediazide substitution compound" are described in, e.g., U.S. Pat. Nos. 3,666,473, 4,115,128, and 4,173,470. Further, an example of the most typical composition comprising "a combination of a cresol-formaldehyde novolak resin and a trihydroxybenzophenone-1,2-naphthoquinonediazidesulfonic acid ester" is described in L. F. Thompson, "Introduction to Microlithography" (ACS Press, No. 2, 19, pp. 112–121).

In such a positive photoresist consisting basically of a novolak resin and a quinonediazide compound, the novolak resin imparts high plasma etching resistance and the naphthoquinonediazide compound functions as a dissolution inhibiting agent. The naphthoquinonediazide has the property of generating a carboxylic acid upon light irradiation to thereby lose its dissolution inhibiting ability and enhance the alkali solubility of the novolak resin.

Many positive photoresists comprising a novolak resin and a photosensitive naphthoquinonediazide compound have been developed and put to practical use so far from the above-described standpoint. These photoresists have produced satisfactory results in the formation of resist patterns having line widths ranging about from 0.8 to 2 μm.

However, the degree of integration in integrated circuits is increasing more and more, and it has become necessary to form an ultrafine pattern having a line width of 0.5 μm or smaller in the production of semiconductor substrates for VLSIs and the like. For attaining the necessary resolving power, the wavelengths of the light sources used for photolithography are decreasing more and more and, as a result, use of far ultraviolet rays and excimer laser beams (XeCl, KrF, ArF, etc.) has come to be investigated.

The prior art resists comprising a novolak and a naphthoquinonediazide compound are unsuitable for use in pattern formation by lithography using far ultraviolet rays or excimer laser beams, because the novolak and the naphthoquinonediazide exhibit intense absorption in the far ultraviolet region to render the light less apt to reach the resist bottom. Thus, the resist has low sensitivity to give only a tapered pattern.

One means for eliminating the above problem is the chemically amplified resist composition described in, e.g., U.S. Pat. No. 4,491,628 and European Patent 249,139. A chemically amplified positive resist composition is a pattern-forming material in which an acid generates in exposed areas upon irradiation with a radiation such as far ultraviolet rays and this acid catalyzes a reaction that makes the areas irradiated with the actinic rays and the unirradiated areas which are different in solubility in a developing solution to thereby form a pattern on a substrate.

Examples thereof include combinations of a compound which generates an acid upon photodecomposition with an acetal or O,N-acetal compound (see JP-A-48-89003; the term "JP-A" as used herein means an "unexamined published Japanese patent application"), with an orthoester or amidoacetal compound (see JP-A-51-120714), with a polymer having acetal or ketal groups in the backbone (see JP-A-53-133429), with an enol ether compound (see JP-A-55-12995), with an N-acyliminocarbonic acid compound (see JP-A-55-126236), with a polymer having orthoester groups in the backbone (see JP-A-56-17345), with a tertiary alkyl ester compound (see JP-A-60-3625), with a silyl ester compound (see JP-A-60-10247), and with a silyl ether compound (see JP-A-60-37549 and JP-A-60-121446). These combinations exhibit high photosensitivity since they have a quantum efficiency exceeding 1 in principle.

Another means for eliminating the problem described hereinabove is a system which is stable over long at room temperature but decomposes upon heating in the presence of an acid to become alkali-soluble. Examples thereof include systems comprising a combination of a compound which generates an acid upon exposure to light with an ester having a tertiary or secondary carbon (e.g., t-butyl or 2-cyclohexenyl) or with a carbonic ester compound, as described in, e.g., JP-A-59-45439, JP-A-60-3625, JP-A-62-229242, JP-A-63-27829, JP-A-63-36240, JP-A-63-250642; *Polym. Eng. Sce.*, Vol. 23, p. 1012 (1983); *ACS. Sym.*, Vol. 242, p. 11 (1984); *Semiconductor World*, p. 91 (November 1987); *Macromolecules*, Vol. 21, p. 1475 (1988); and *SPIE*, Vol. 920, p. 42 (1988). Since these systems also have high sensitivity and exhibit reduced absorption in the deep UV region as compared with the naphthoquinonediazide/novolak resin systems, they can be effective systems for coping with the wavelength reduction in light sources.

The chemically amplified positive resists described above are roughly divided into two groups: three-component systems comprising an alkali-soluble resin, a compound which generates an acid upon exposure to a radiation (photo-acid generator), and a dissolution inhibitive compound for the alkali-soluble resin which has acid-decomposable groups; and two-component systems comprising a resin which decomposes upon reaction with an acid to become alkali-soluble and a photo-acid generator.

In these two-component or three-component, chemically amplified positive resists, the photo-acid generator is caused to generate an acid by exposure to light and the resists are then heat-treated and developed in the presence of the acid to obtain a resist pattern.

Known photo-acid generators for use in the above-described chemically amplified positive resists include N-imidosulfonates, N-oximesulfonates, o-nitrobenzylsulfonates, and pyrogallol trismethanesulfonate. Typical compounds which have been used as photo-acid generators having a high photodecomposition efficiency and excellent image-forming properties are the sulfonium and iodonium salts of perfluorinated Lewis acids, e.g., $PF_6^-$, $AsF_6^-$, and $SbF_6^-$, described in, e.g., JP-A-59-45439 and *Polym. Eng. Sci.*, 23, 1012 (1983).

However, these prior art photo-acid generators, when used in resist materials for semiconductors, have a problem that the counter anions of the photo-acid generators cause pollution by phosphorus, arsenic, antimony, etc.

Used as a sulfonium or iodonium compound free from the pollution is the salt described in, e.g., JP-A-63-27829, JP-A-2-25850, JP-A-2-150848, JP-A-5-134414, and JP-A-5-232705, in which the counter anion is a trifluoromethanesulfonate anion.

It should, however, be noted that this prior art composition has a problem that since trifluoromethanesulfonic acid, which generates upon exposure to light, diffuses relatively rapidly in the resist film, the line width of the resist pattern which is being produced becomes narrower with the lapse of time from exposure to light to heat treatment or the resist pattern comes to have a T-top surface.

Although use of a toluenesulfonate anion as another counter anion for sulfonium or iodonium is described in, e.g., JP-A-2-25850, JP-A-2-150848, JP-A-6-43653, and JP-A-6-123972, this salt has a problem that since it has insufficient solubility in ordinary resist solvents, the addition amount thereof is limited, resulting in insufficient sensitivity.

Further, the use of resins having a sulfonium group in the polymer backbone or in side chains thereof is disclosed, e.g., in JP-A-2-302758, JP-A-4-230645, and U.S. Pat. Nos. 5,130,392 and 5,260,410. These resins having a sulfonium group have the same problem in diffusibility in a resist film as that of the sulfonium or iodonium compound having a trifluoromethanesulfonate anion as the counter anion, since an acid itself they generate upon exposure to light is a low-molecular monomer.

SUMMARY OF THE INVENTION

Accordingly, an object of the present invention is to eliminate the problems of the prior art techniques described above, specifically to provide a photosensitive composition which contains a novel sulfonium or iodonium salt resin having a high photodecomposition efficiency and having counter anions in polymer chains.

Another object of the present invention is to provide a positive photosensitive composition which contains the above novel resin, has high sensitivity, and is capable of giving an excellent resist pattern.

Still another object of the present invention is to provide a positive photosensitive composition which, upon exposure to light, generates an acid having reduced diffusibility and hence gives a resist pattern which neither suffers a line width decrease with the lapse of time from exposure to light to heat treatment nor comes to have a T-top surface.

A further object of the present invention is to provide a positive photosensitive composition containing, as a photoacid generator, a sulfonium or iodonium compound which has improved solvent solubility and can be incorporated in the composition in any desired amount to thereby improve sensitivity.

As a result of intensive investigations made by the present inventors while taking account of the properties described above, they have found that the objects of the present invention are accomplished by using the following specific compound which generates a sulfonic acid.

The present invention provides compositions having the following constitutions.

(1) A photosensitive composition containing a sulfonium or iodonium salt resin having at least one of repeating structural units represented by formulae (I) to (IV):

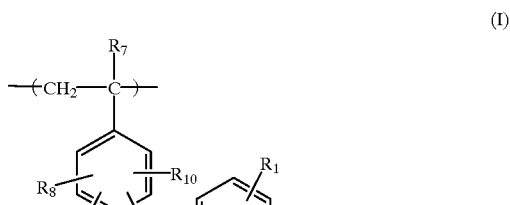

(I)

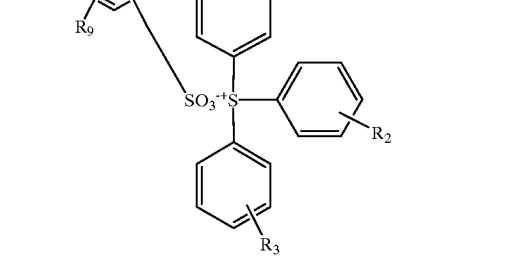

(II)

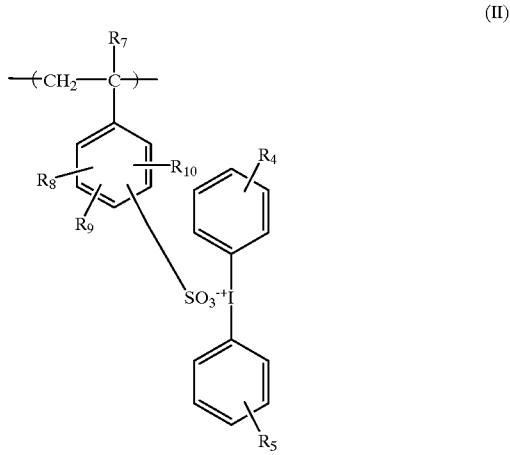

(III)

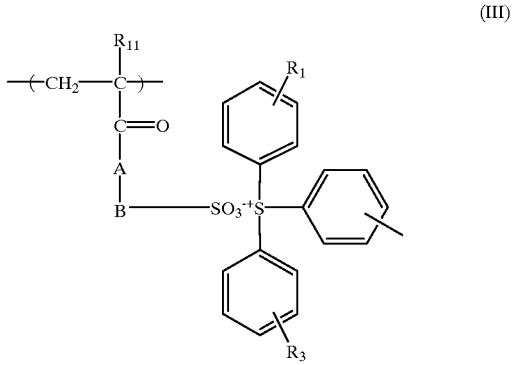

(IV)

wherein $R_1$ to $R_5$ each independently represents a hydrogen atom, a hydroxy group, a halogen atom, an alkyl group which may have substituent(s), a cycloalkyl group which may have substituent(s), an alkoxy group which may have substituent(s), or a group represented by —S—$R_6$, wherein $R_6$ represents an alkyl group which may have substituent(s) or an aryl group which may have substituent(s); $R_7$ and $R_{11}$, each independently represents a hydrogen atom, a halogen atom, a cyano group, or an alkyl group which may have substituent(s); $R_8$ to $R_{10}$ each independently represents a hydrogen atom, a hydroxy group, a halogen atom, a nitro group, a carboxyl group, or an alkyl group which may have substituent(s), an aralkyl group which may have substituent (s), or an alkoxy group which may have substituent(s); A represents —O— or a group represented by —$NR_{12}$—, wherein $R_{12}$ represents a hydrogen atom or an alkyl group which may have substituent(s) or an aryl group which may have substituent(s); and B represents an alkylene group which may have substituent(s) or an arylene group which may have substituent(s).

(2) A positive photosensitive composition comprising a resin having groups which decompose by the action of an acid to enhance solubility of the resin in an alkaline developing solution and a resin which has at least one kind of repeating structural units represented by formulae (I) to (IV) as described in (1) above and generates a sulfonic acid upon irradiation with actinic rays or a radiation.

(3) The positive photosensitive composition as described in (2) above, which contains a low-molecular acid-decomposable dissolution inhibitive compound having a molecular weight of 3,000 or lower which has groups decomposable by an acid and shows enhanced solubility of the dissolution inhibitive compound in an alkaline developing solution by the action of an acid.

(4) The positive photosensitive composition as described in (2) or (3) above, which contains a resin insoluble in water and soluble in an aqueous alkali solution.

(5) A positive photosensitive composition comprising a resin which has at least one kind of repeating structural units represented by formulae (I) to (IV) as described in (1) above and generates a sulfonic acid upon irradiation with actinic rays or a radiation, a low-molecular acid-decomposable dissolution inhibitive compound having a molecular weight of 3,000 or lower which has groups decomposable by an acid and shows enhanced solubility of the dissolution inhibitive compound in an alkaline developing solution by the action of an acid, and a resin insoluble in water and soluble in an aqueous alkali solution.

The use of the resin having at least one kind of repeating structural units represented by formulae (I) to (IV), which is useful as a photo-acid generator, in a resist, particularly in a chemically amplified type resist, can overcome the problem caused during the lapse of time from light exposure to heat treatment, and since the acid generator has improved solvent solubility and a high photodecomposition efficiency, the resulting resist has high photosensitivity and is capable of giving an excellent resist pattern.

DETAILED DESCRIPTION OF THE INVENTION

The compounds used in the present invention are explained below in detail.

[I] Resin Having Repeating Structural Units Represented by Formulae (I) to (IV)

Examples of the alkyl group represented by $R_1$ to $R_6$ in formulae (I) to (IV) include an alkyl group having 1 to 8 carbon atoms (e.g., methyl, ethyl, propyl, n-butyl, sec-butyl, t-butyl, hexyl and octyl), which may have substituent(s). Examples of the cycloalkyl group include a cycloalkyl group having 3 to 8 carbon atoms (e.g., cyclopropyl, cyclopentyl and cyclohexyl), which may have substituent(s). Examples of the alkoxy group include those having 1 to 8 carbon atoms (e.g., methoxy, ethoxy, hydroxyethoxy, propoxy, n-butoxy, isobutoxy, sec-butoxy, t-butoxy, hexyloxy, and octyloxy), which may have substituent(s). Examples of the halogen atom include fluorine, chlorine, bromine and iodine. Examples of the aryl group include an aryl group having 6 to 14 carbon atoms (e.g., phenyl, tolyl, methoxyphenyl and naphthyl), which may have substituent(s).

Preferred examples of the substituent which $R_1$ to $R_6$ may have include an alkoxy group having 1 to 4 carbon atoms, a halogen atom (fluorine, chlorine, and iodine), an aryl group having 6 to 10 carbon atoms, an alkenyl group having 2 to 6 carbon atoms, a cyano group, a hydroxy group, a carboxy group, an alkoxycarbonyl group, and a nitro group.

Examples of the alkyl group represented by $R_7$ and $R_{11}$, include an alkyl group having 1 to 4 carbon atoms (e.g., methyl, ethyl, propyl, n-butyl, sec-butyl and t-butyl), which may have substituent(s). Examples of the halogen atom include the same halogen atoms as those enumerated above with regard to $R_1$ to $R_6$. Preferably, $R_7$ and $R_{11}$ each independently is a hydrogen atom, an optionally substituted methyl group, a halogen atom, or a cyano group.

Examples of the alkyl group, the alkoxy group and the halogen atom represented by $R_8$ to $R_{10}$ include the same alkyl and alkoxy groups and halogen atoms as those enumerated above with regard to $R_1$ to $R_6$. Examples of the aralkyl group include an aralkyl group having 7 to 12 carbon atoms (e.g., benzyl and phenethyl), which may have substituent(s).

Examples of the alkyl group represented by $R_{12}$ include an alkyl group having 1 to 4 carbon atoms (e.g., methyl, ethyl, propyl, n-butyl, sec-butyl and t-butyl), which may have substitutent(s). Examples of the aryl group include an aryl group having 6 to 14 carbon atoms (e.g., phenyl and naphthyl), which may have substitutent(s).

Examples of the alkylene group represented by B include an alkylene group having 1 to 8 carbon atoms (e.g., methylene, ethylene, propylene, butylene, hexylene and octylene), which may have substitutent(s). Examples of the arylene group include an arylene group having 6 to 14 carbon atoms (e.g., phenylene, 4,α-phenylmethylene, and naphthylene), which may have substitutent(s). Preferred examples of the substituent include the same preferred substituents as those enumerated above with regard to $R_1$ to $R_6$.

The resin having at least one repeating structural units represented by formulae (I) to (IV) may be a homopolymer of any one of the monomers represented by the following general formulae (V) to (VIII). However, the resin is preferably a copolymer of any one of those monomers with one or more other compounds having a polymerizable ethylenically unsaturated bond. In this case, the content of the structural units derived from the compound represented by one of general formulae (V) to (VIII) is preferably from 5 to 80% by mole based on the total amount of all structural units in the resin. The content thereof is more preferably from 10 to 70% by mole, most preferably from 20 to 50% by mole. The resin for use in the present invention may have two or more kinds of structural repeating units represented by formulae (I) to (IV).

(V)

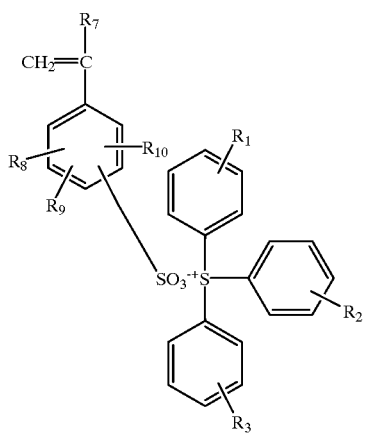

(VI)

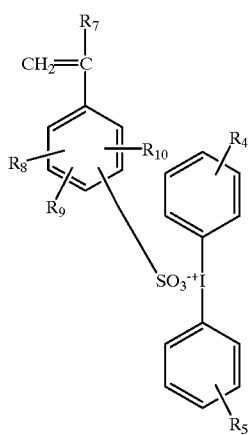

(VII)

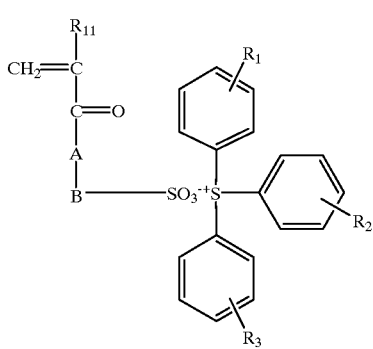

(VIII)

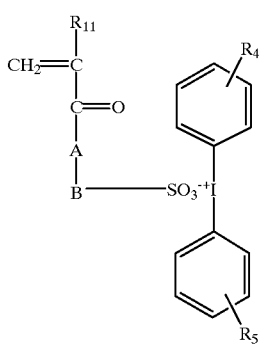

In formulae (V) to (VIII), $R_1$ to $R_{12}$, A, and B have the same meanings as in general formulae (I) to (IV).

Preferred examples of the compound having a polymerizable ethylenically unsaturated bond which can be used in combination with the monomers giving repeating structural units represented by general formulae (I) to (IV) include compounds having one addition-polymerizable unsaturated bond selected from acrylic esters, acrylamide and analogues thereof, methacrylic esters, methacrylamide and analogues thereof, allyl compounds, vinyl ethers, vinyl esters, styrene and analogues thereof, crotonic esters, and the like. Examples thereof include acrylic esters such as alkyl acrylates (the alkyl group preferably has 1 to 10 carbon atoms) (e.g., methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, and tetrahydofurfuryl acrylate) and aryl acrylates (e.g., phenyl acrylate and hydroxyphenyl acrylate); methacrylic esters such as alkyl methacrylates (the alkyl group preferably has 1 to 10 carbon atoms) (e.g., methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, and tetrahydrofurfuryl methacrylate) and aryl methacrylates (e.g., phenyl methacrylate, hydroxyphenyl methacrylate, cresyl methacrylate, and naphthyl methacrylate); acrylamide and analogues thereof such as N-alkylacrylamides (examples of the alkyl group include those having 1 to 10 carbon atoms, such as methyl, ethyl, propyl, butyl, t-butyl, heptyl, octyl, cyclohexyl, benzyl, hydroxyethyl, and benzyl), N-arylacrylamides (examples of the aryl group include phenyl, tolyl, nitrophenyl, naphthyl, cyanophenyl, hydroxyphenyl, and carboxyphenyl), N,N-dialkylacrylamides (examples of the alkyl groups include those having 1 to 10 carbon atoms, such as methyl, ethyl, butyl, isobutyl, ethylhexyl, and cyclohexyl), N,N-arylacrylamides (examples of the aryl group include phenyl), N-methyl-N-phenylacrylamide, N-hydroxyethyl-N-methylacrylamide, and N-2-acetamidoethyl-N-acetylacrylamide; methacrylamide and analogues thereof such as N-alkylmethacrylamides (examples of the alkyl group include those having 1 to 10 carbon atoms, e.g., methyl, ethyl, t-butyl, ethylhexyl, hydroxyethyl, and cyclohexyl), N-arylmethacrylamides (examples of the aryl group include phenyl, hydroxyphenyl, and carboxyphenyl), N,N-dialkylmethacrylamides (examples of the alkyl groups include ethyl, propyl, and butyl), N,N-diarylmethacrylamides (examples of the aryl groups include phenyl), N-hydroxyethyl-N-methylmethacrylamide, N-methyl-N-phenylmethacrylamide, and N-ethyl-N-phenylmethacrylamide; allyl compounds such as allyl esters (e.g., allyl acetate, allyl caproate, allyl caprylate, allyl laurate, allyl palmitate, allyl stearate, allyl benzoate, allyl acetoacetate, and allyl lactate) and allyloxyethanol; vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether) and vinyl aryl ethers (e.g., vinyl phenyl ether, vinyl tolyl ether, vinyl chlorophenyl ether, vinyl 2,4-dichlorophenyl ether, vinyl naphthyl ether, and vinyl anthranyl ether); vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate, and vinyl naphthoate; styrene and analogues thereof such as alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, and acetoxymethylstyrene), alkoxystyrenes (e. g., methoxystyrene, 4-methoxy-3-methylstyrene, and dimethoxystyrene), halogenostyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene), hydroxystyrenes (e.g., 4-hydroxystyrene, 3-hydroxystyrene, 2-hydroxystyrene, 4-hydroxy-3-methylstyrene, 4-hydroxy-3,5-dimethylstyrene, 4-hydroxy-3-methoxystyrene, and 4-hydroxy-3-(2-hydroxybenzyl) styrene), and carboxystyrenes; crotonic esters such as alkyl crotonates (e.g., butyl crotonate, hexyl crotonate, and glycerol monocrotonate); dialkyl itaconates (e.g., dimethyl itaconate, diethyl itaconate, and dibutyl itaconate); dialkyl maleates and fumarates (e.g., dimethyl maleate and dibutyl fumarate) and monoalkyl maleates and fumarates; and other compounds such as acrylic acid, methacrylic acid, crotonic acid, itaconic acid, maleic anhydride, maleimide, acrylonitrile, methacrylonitrile, and maleonitrile. Any unsaturated compound can be used, as long as it is an addition-polymerizable unsaturated compound copolymerizable with the compound represented by formulae (V) to (VIII) to be used in combination.

Among the compounds enumerated above, those capable of improving alkali solubility are preferred. Specifically, examples of such a comonomer include the monoalkyl esters of acrylic, methacrylic, itaconic, crotonic, maleic, and fumaric acids, monomers having a carboxyl group such as carboxystyrenes, N-(carboxyphenyl)acrylamide, and N-(carboxyphenyl)methacrylamide, monomers having a phenolic hydroxyl group such as hydroxystyrenes, N-(hydroxyphenyl)acrylamide, N-(hydroxyphenyl)methacrylamide, hydroxyphenyl acrylate, and hydroxyphenyl methacrylate, and maleimide.

The above-described resin for use in the present invention, which has repeating structural units represented by formulae (I) to (IV), may be either a random copolymer or a block copolymer.

The molecular weight of the resin for use in the present invention is generally 1,000 or higher, preferably from 5,000 to 1,000,000, more preferably from 10,000 to 100,000, in terms of weight-average molecular weight (reduced to polystyrene).

In the case where the sulfonium or iodonium salt resin having at least one kind of repeating structural units represented by formulae (I) to (IV) is used in the positive photosensitive composition according to the present invention, the content thereof is generally from 0.1 to 20% by weight, preferably from 0.5 to 10% by weight, more preferably from 1 to 7% by weight, based on the total amount of all solid components of the composition.

The sulfonium or iodonium salt resin having repeating structural units represented by at least one of general formulae (I) to (IV) can be synthesized from a combination of at least one monomer represented by any of general formulae (V) to (VIII) with one or more other suitable polymerizable monomers and a radical polymerization initiator catalyst by polymerizing these monomers in an appropriate solvent with heating in a nitrogen stream. It is also possible to synthesize the resin by polymerizing the salt of a monomer represented by any of general formulae (V) to (VIII) with $Y^+$ ($Y^+$ represents a monovalent cation such as $H^+$, $Na^+$, $K^+$, $NH_4^+$, or $N(CH_3)_4^+$) in the same manner as the above and then reacting the resulting polymer with an aqueous solution of the $Cl^-$ salt corresponding to the sulfonium or iodonium in the monomer represented by any of general formulae (V) to (VIII) to conduct salt interchange.

Examples of the monomers represented by general formulae (V) to (VIII) used as starting materials for the resin for use in the present invention are given below. However, the resin should not be construed as being limited to those obtained from these examples.

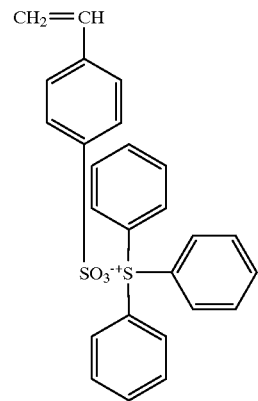

(V-1)

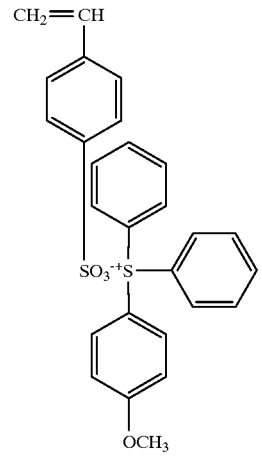

(V-2)

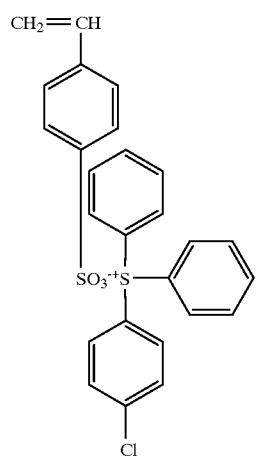 (V-3)
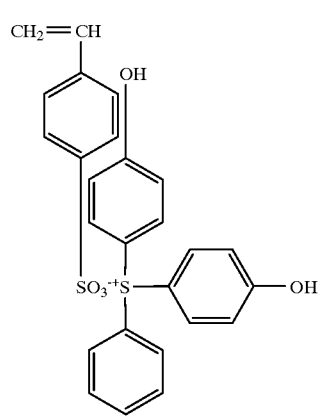 (V-4)
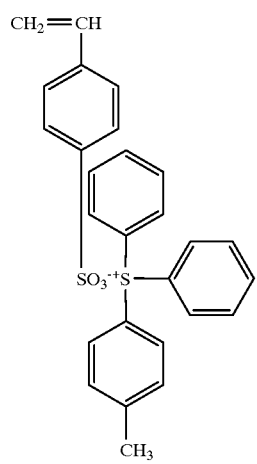 (V-5)
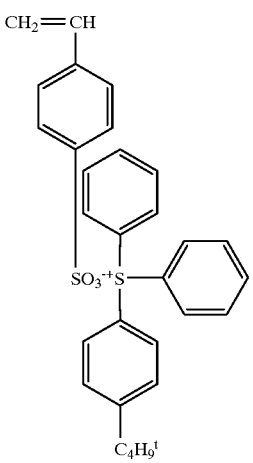 (V-6)
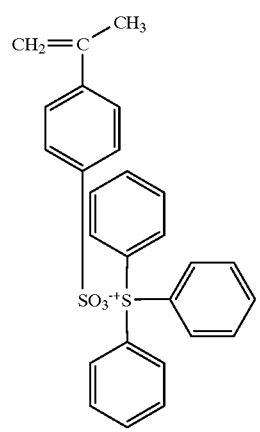 (V-7)
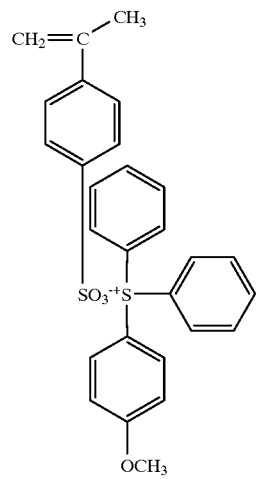 (V-8)

(V-9) 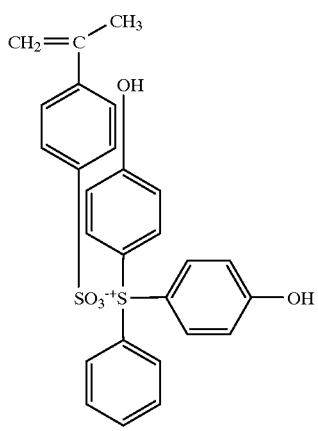
(V-10) 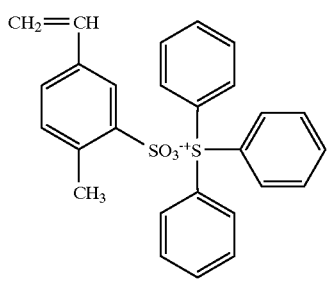
(V-11) 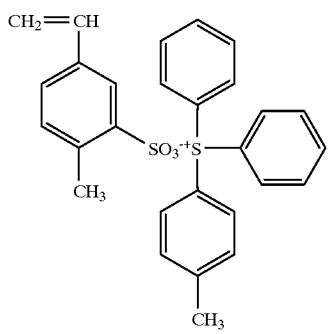
(V-12) 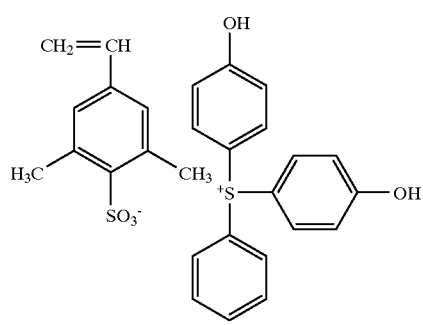
(VI-1) 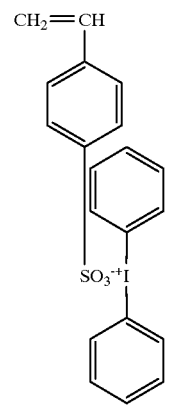
(VI-2) 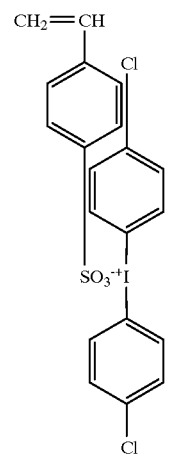
(VI-3) 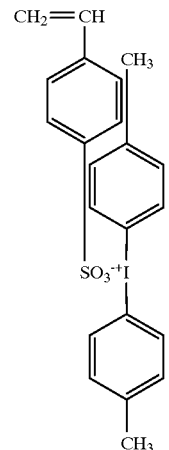

(VI-4) 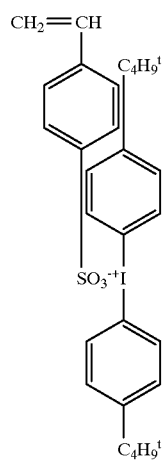
(VI-5) 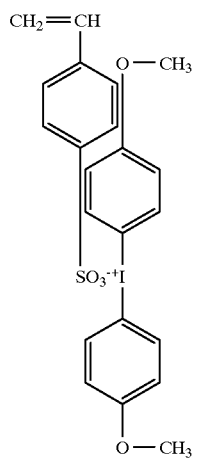
(VI-6) 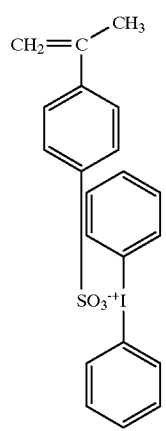
(VI-7) 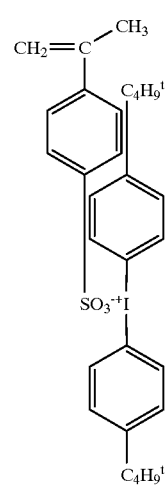
(VI-8) 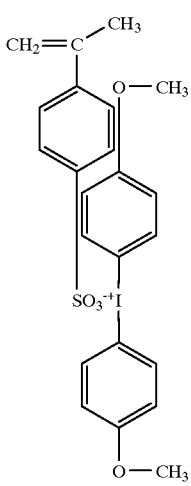
(VI-9) 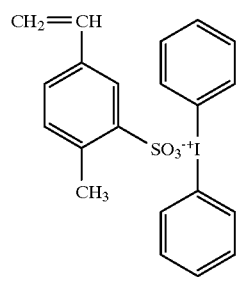

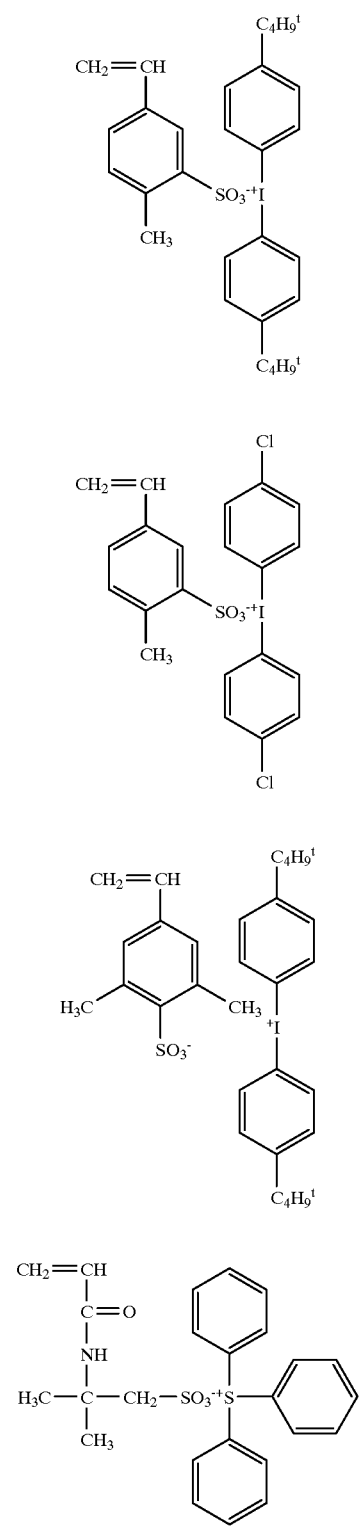
(VI-10)
(VI-11)
(VI-12)
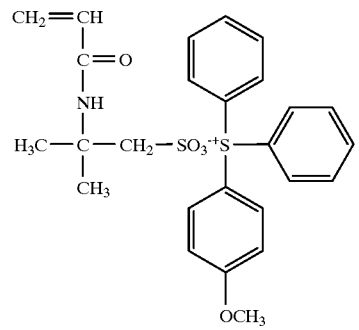
(VII-2)
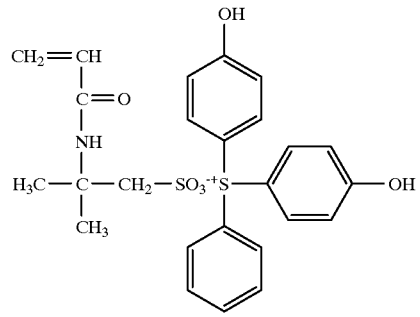
(VII-3)
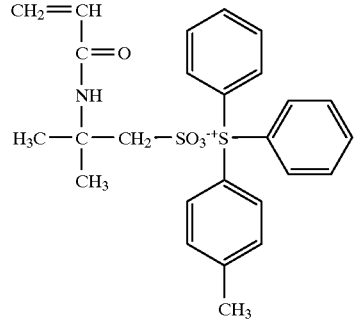
(VII-4)
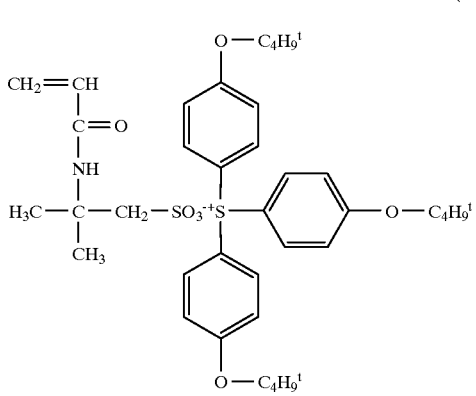
(VII-5)
(VII-1)

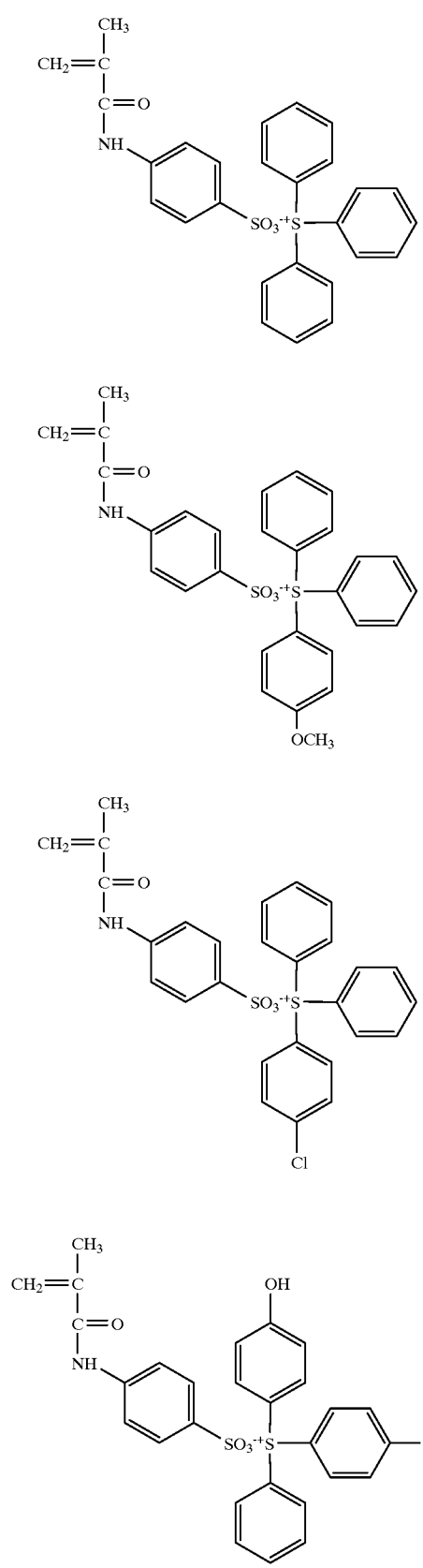
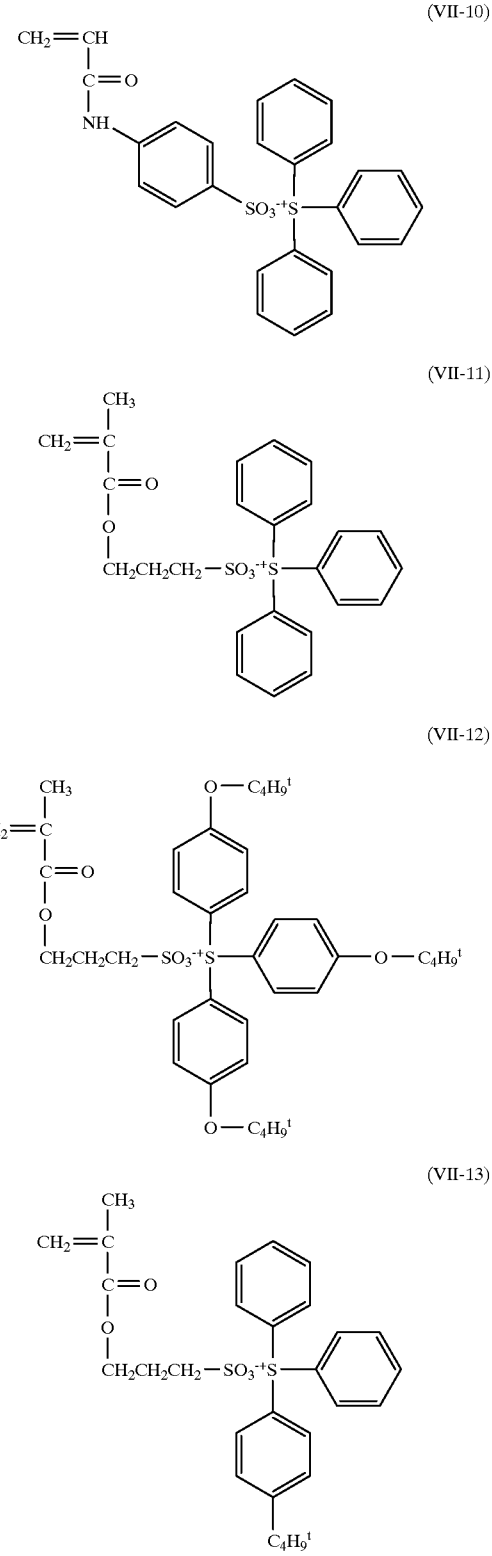

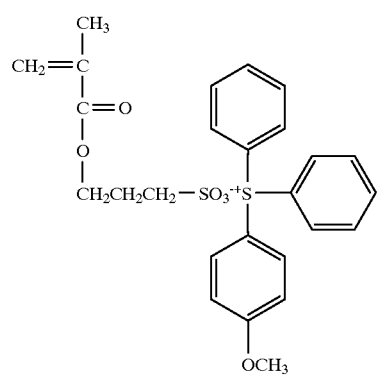 (VII-14)
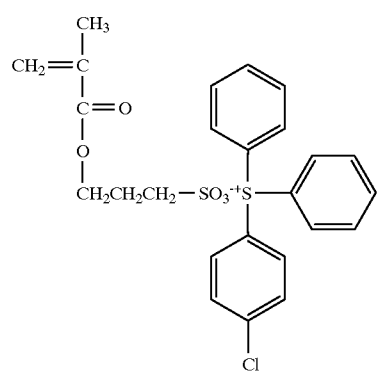 (VII-15)
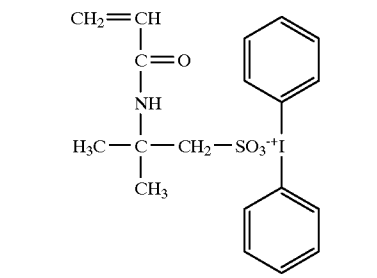 (VIII-1)
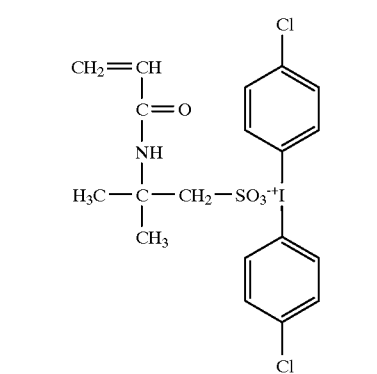 (VIII-2)
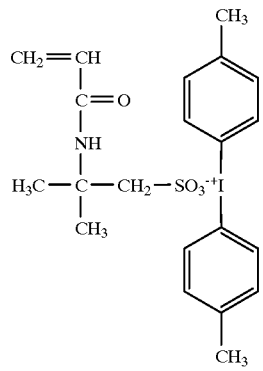 (VIII-3)
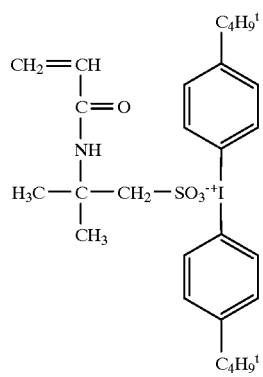 (VIII-4)
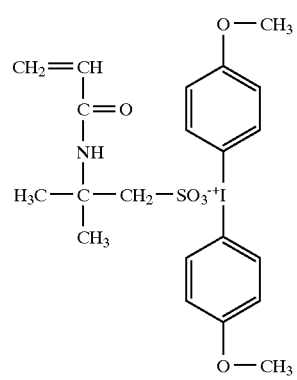 (VIII-5)
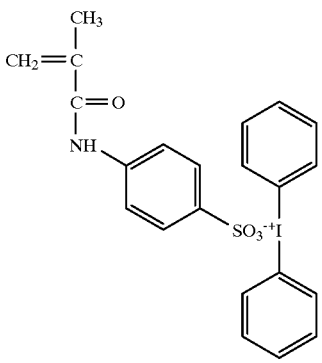 (VIII-6)

(VIII-7) 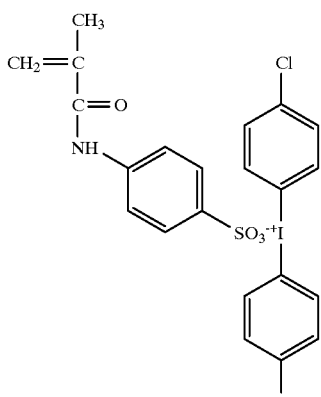

(VIII-8) 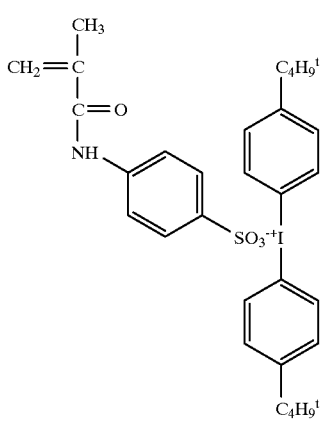

(VIII-9) 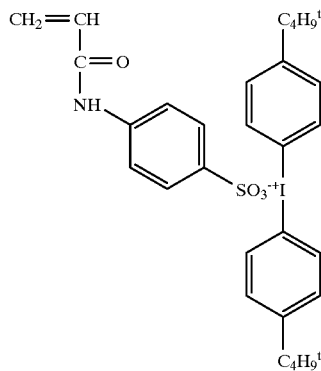

(VIII-10) 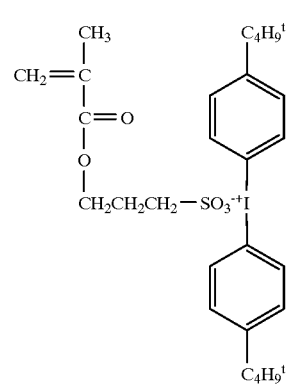

(VIII-11) 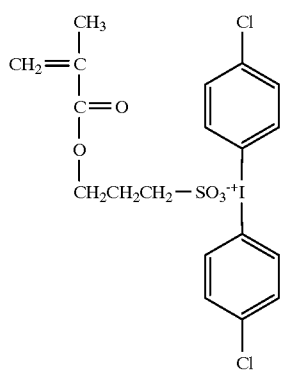

Examples of the resin having repeating structural unit represented by any of general formulae (I) to (IV) and is synthesized using any of the above-enumerated starting monomers represented by formulae (V) to (VIII) are shown below. However, the present invention should not be construed as being limited to compositions containing these resins.

TABLE 1

Resins for use in the invention having repeating structural units represented by general formulae (I) to (IV)

| Resin for use in the invention | Starting monomer represented by general formula (V) to (VIII) | Consumer | Proportion (mol %) (monomer according to the invention/ comonomer) | Weight-average molecular weight (×10³) |
|---|---|---|---|---|
| (I-1) | (V-1) | MAA | 50/50 | 22.5 |
| (I-2) | (V-1) | HSt | 30/70 | 24.6 |
| (I-3) | (V-1) | CSt | 50/50 | 18.7 |
| (I-4) | (V-1) | MMBz | 40/60 | 33.2 |
| (I-5) | (V-2) | HPMAm | 30/70 | 23.1 |
| (I-6) | (V-4) | MAA/BMA | 30/40/40 | 34.5 |
| (I-7) | (V-5) | HSt | 30/70 | 25.2 |
| (I-8) | (V-7) | CSt/St | 30/40/40 | 21.5 |
| (I-9) | (V-10) | HSt | 30/70 | 19.2 |
| (III-1) | (VII-1) | MAA/BMA | 30/40/40 | 37.4 |
| (III-2) | (VII-3) | HSt | 30/70 | 25.8 |
| (III-3) | (VII-4) | HPMAm | 30/70 | 28.6 |
| (III-4) | (VII-6) | HPMAm | 30/70 | 35.3 |
| (III-5) | (VII-6) | MAA/AN | 30/40/40 | 29.2 |
| (III-6) | (VII-11) | MMBz | 40/60 | 18.4 |
| (II-1) | (VI-1) | MMBz | 40/60 | 25.9 |
| (II-2) | (VI-1) | HSt | 30/70 | 27.8 |
| (II-3) | (VI-4) | HSt | 30/70 | 25.6 |
| (II-4) | (VI-4) | CSt/St | 30/40/40 | 19.6 |
| (II-5) | (VI-4) | MAA/BMA | 30/40/40 | 27.5 |
| (II-6) | (VI-5) | MAA | 50/50 | 26.8 |
| (II-7) | (VI-10) | CSt | 50/50 | 16.2 |
| (IV-1) | (VIII-1) | MMBz | 40/60 | 29.5 |
| (IV-2) | (VIII-7) | HPMAm | 30/70 | 35.6 |
| (IV-3) | (VIII-8) | HSt | 30/70 | 24.8 |
| (IV-4) | (VIII-8) | CSt | 50/50 | 18.5 |
| (IV-5) | (VIII-10) | MAA/BMA | 30/40/40 | 32.6 |

Comonomers Used in Table 1
HSt: 4-hydroxystyrene
CSt: 4-carboxystyrene
St: styrene
MMBz: monobenzyl maleate
MAA: methacrylic acid
BMA: benzyl methacrylate
AN: acrylonitrile
HPMAm: N-(4-hydroxyphenyl)methacrylamide

[II] Other Usable Photo-acid Generators

In the present invention, the compound represented by formulae (I) to (IV), which generates a sulfonic acid, may be used in combination with one or more other compounds which decompose upon irradiation with actinic rays or a radiation to generate an acid.

The proportion of the compound represented by formulae (I) to (IV) according to the present invention to one or more other photo-acid generators usable therewith is generally from 100/0 to 20/80, preferably from 90/10 to 40/60, more preferably from 80/20 to 50/50, by mole.

Examples of such photo-acid generators usable in combination with the specific photo-acid generator include photoinitiators for cationic photopolymerization, photoinitiators for radical photopolymerization, photodecolorants for dyes, optical color changers, and known compounds which generate an acid by the action of light and are used in microresists, etc. These optional photo-acid generators may be suitably used either alone or as a mixture of two or more thereof.

Specific examples thereof include onium salts such as: the diazonium salts described in, e.g., S. I. Schlesinger, *Photogr. Sci. Eng.*, 18, 387 (1974) and T. S. Bal et al., *Polymer*, 21, 423 (1980); the ammonium salts described in, e.g., U.S. Pat. Nos. 4,069,055 and 4,069,056, U.S. Reissued Pat. No. 27,992, and Japanese Patent Application No. 3-140,140; the phosphonium salts described in, e.g., D. C. Necker et al., *Macromolecules*, 17, 2468 (1984), C. S. Wen et al., *Teh, Proc. Conf. Rad. Curing ASIA*, p. 478 Tokyo, October (1988), and U.S. Pat. Nos. 4,069,055 and 4,069,056; the iodonium salts described in, e.g., J. V. Crivello et al., *Macromolecules*, 10 (6), 1307 (1977), *Chem. & Eng. News*, November 28, p. 31 (1988), European Patent 104,143, U.S. Pat. Nos. 339,049 and 410,201, JP-A-2-150,848, and JP-A-2-296,514; the sulfonium salts described in, e.g., J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patents 370,693, 3,902,114, 233,567, 297,443, and 297,442, U.S. Pat. Nos. 4,933,377, 161,811, 410,201, 339, 049, 4,760,013, 4,734,444, and 2,833,827, and German Patents 2,904,626, 3,604,580, and 3,604,581; the selenonium salts described in, e.g., J. V. Crivello et al., *Macromolecules*, 10 (6), 1307 (1977) and J. V. Crivello et al., *J. Polymer Sci., Polymer Chem. Ed.*, 17, 1047 (1979); and the arsonium salts described in, e.g., C. S. Wen et al., *Teh, Proc. Conf. Rad. Curing ASIA*, p. 478 Tokyo, October (1988). Specific examples thereof further include the organohalogen compounds described in, e.g., U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; the organometallic compound/organic halide combinations described in, e.g., K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), and JP-A-2-161445; the photo-acid generators having an o-nitrobenzyl type protective group described in, e.g., S. Hayase et al., *J. Polymer Sci.*, 25, 753 (1987), E. Reichmanis et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290,750, 046,083, 156,535, 271,851, and 0,388, 343, U.S. Pat. Nos. 3,901,710 and 4,181,531, JP-A-60-198538, and JP-A-53-133022; compounds which photodecompose to generate a sulfonic acid and are represented by the iminosulfonates described in, e.g., M. Tunooka et al., *Polymer Preprints*, Japan, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints*, Japan, 37 (3), European Patents 0,199,672, 84,515, 199,672, 044, 115, and 0,101,122, U.S. Pat. Nos. 618,564, 4,371,605, and 4,431,774, JP-A-64-18143, JP-A-2-245756, and Japanese Patent Application No. 3-140109; and the disulfone compounds described in, e.g., JP-A-61-166544.

Further, a compound obtained by incorporating such groups or compounds which generate an acid by the action of light into the backbone or side chains of a polymer can be used. Examples of this polymeric compound are given in, e.g., M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9,625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are the compounds which generate an acid by the action of light as described in, e.g., V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, and European Patent 126,712.

Of the optionally usable compounds enumerated above which generate an acid upon irradiation with actinic rays or a radiation, especially effective compounds are explained below. (1) Trihalomethyl-substituted oxazole derivatives represented by the following general formula (PAG1) and trihalomethyl-substituted s-triazine derivatives represented by the following general formula (PAG2).

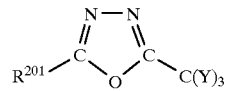

(PAG1)

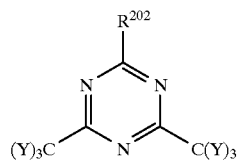

(PAG2)

In the above formulae, $R^{201}$ represents a substituted or unsubstituted aryl or alkenyl group; $R^{202}$ represents a substituted or unsubstituted aryl, alkenyl, or alkyl group or —C(Y)$_3$; and Y represents a chlorine or bromine atom.

Specific examples thereof are given below, but the compounds represented by general formula (PAG1) or (PAG2) should not be construed as being limited thereto.

(PAG1-1) 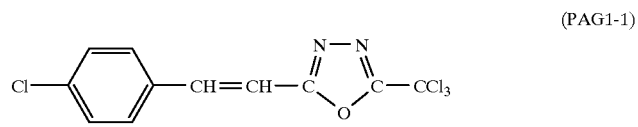
(PAG1-2) 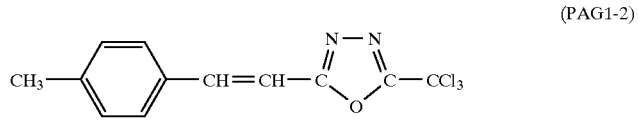
(PAG1-3) 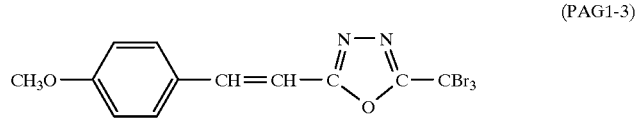
(PAG1-4) 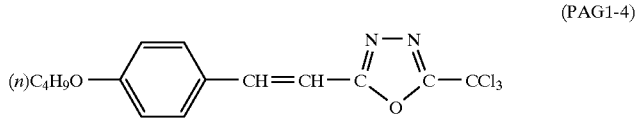
(PAG1-5) 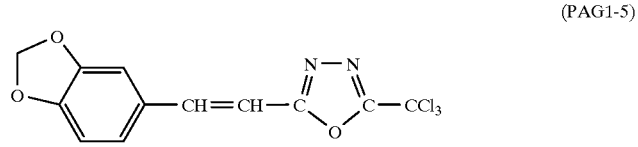
(PAG1-6) 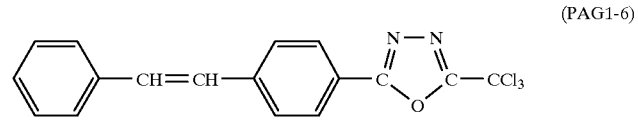
(PAG1-7) 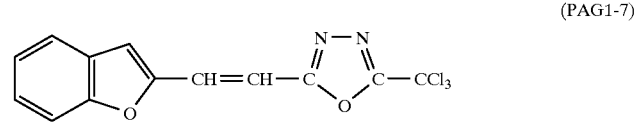
(PAG1-8) 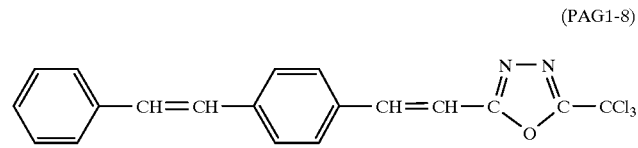
(PAG2-1) 
(PAG2-2) 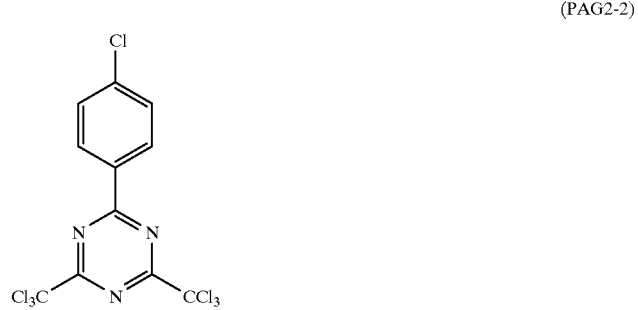

(PAG2-3)
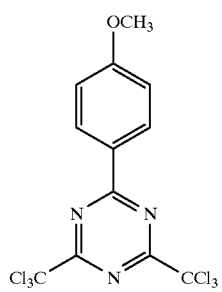
(PAG2-4)
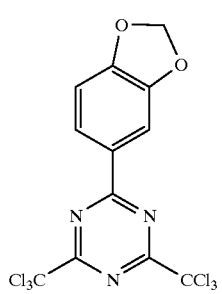
(PAG2-5)
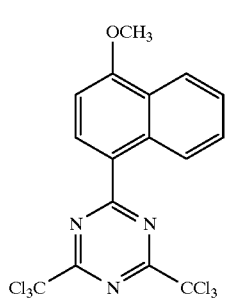
(PAG2-6)
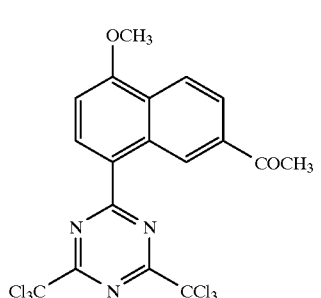
(PAG2-7)
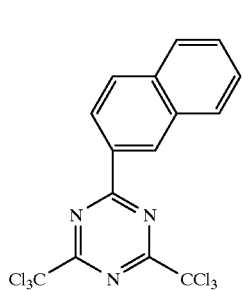

(PAG2-8)

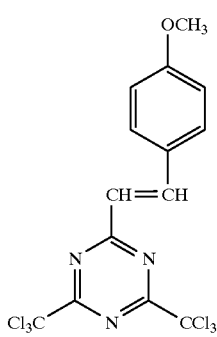

(PAG2-9)

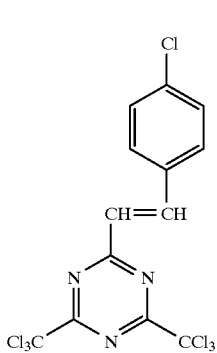

(PAG2-10)

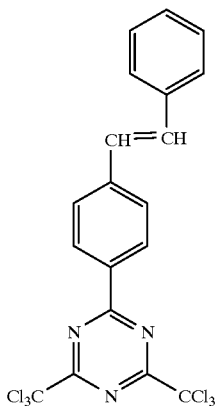

(2) Iodonium salts represented by the following general formula (PAG3) and sulfonium salts represented by the following general formula (PAG4).

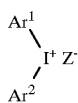

(PAG3)

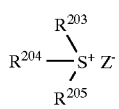

(PAG4)

In the above formulae, $Ar^1$ and $Ar^2$ each independently represents a substituted or unsubstituted aryl group. Preferred substituents include alkyl groups, haloalkyl groups, cycloalkyl groups, aryl groups, alkoxy groups, nitro, carboxyl, alkoxycarbonyl groups, hydroxy, mercapto, and halogen atoms.

$R^{203}$, $R^{204}$, and $R^{205}$ each independently represents a substituted or unsubstituted alkyl or aryl group, and preferably represents an aryl group having 6 to 14 carbon atoms, an alkyl group having 1 to 8 carbon atoms, or a substitution derivative thereof. Preferred substituents for the aryl group include alkoxy groups having 1 to 8 carbon atoms, alkyl groups having 1 to 8 carbon atoms, nitro, carboxyl, hydroxy, and halogen atoms. Preferred substituents for the alkyl group include alkoxy groups having 1 to 8 carbon atoms, carboxyl, and alkoxycarbonyl groups.

$Z^-$ represents a counter anion, specifically a perfluoroalkanesulfonate anion, e.g., $CF_3SO_3^-$, or a pentafluorobenzenesulfonate anion.

Two of $R^{203}$, $R^{204}$, and $R^{205}$ may be bonded to each other through a single bond or substituent thereof. $Ar^1$ and $Ar^2$ may be bonded to each other likewise.

Specific examples thereof are given below, but the compounds represented by general formula (PAG3) or (PAG4) should not be construed as being limited thereto.

(PAG3-1)
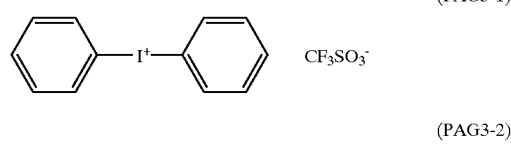
(PAG3-2)
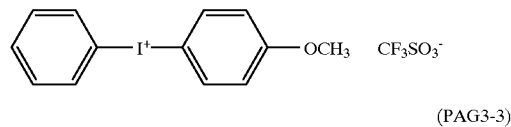
(PAG3-3)
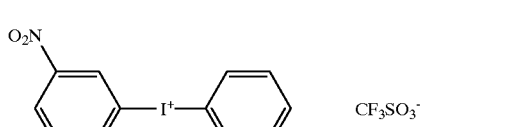
(PAG3-4)
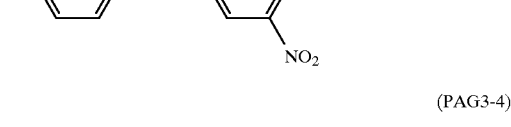
(PAG3-5)
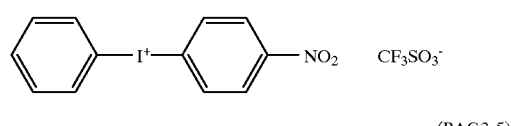
(PAG3-6)
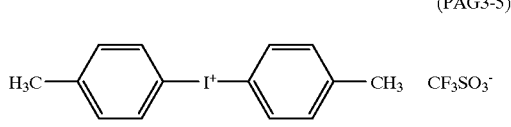
(PAG3-7)
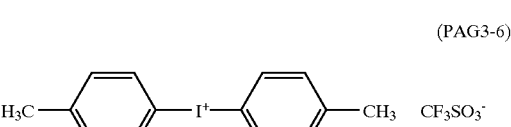
(PAG3-8)
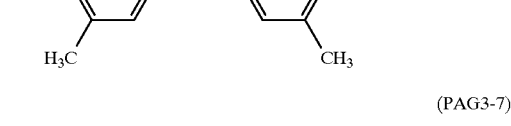
(PAG3-9)
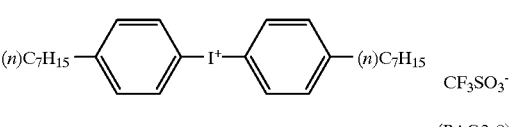
(PAG3-10)
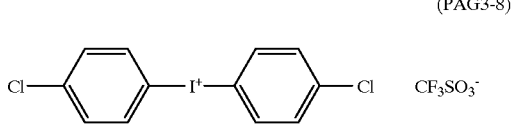
-continued
(PAG3-11)
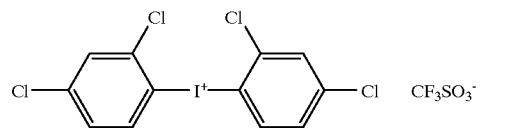
(PAG3-12)
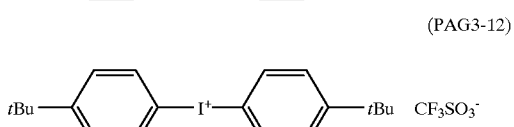
(PAG3-13)
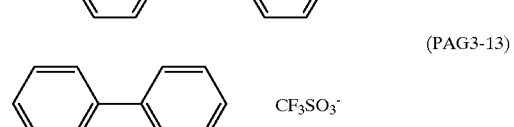
(PAG3-14)
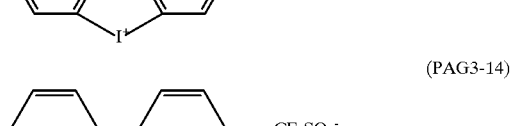
(PAG3-15)
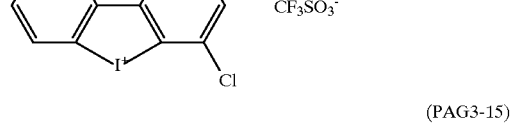
(PAG3-16)
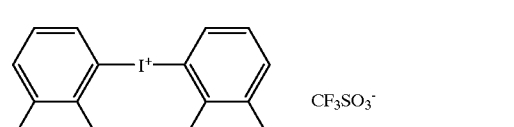
(PAG3-17)
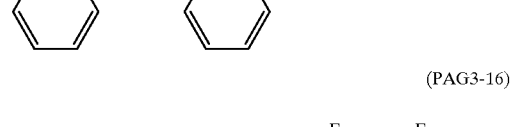
(PAG4-1)
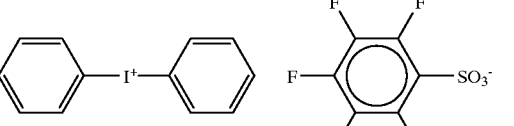
(PAG4-2)
(PAG4-3)
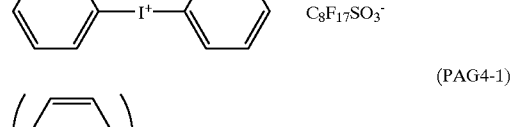

(PAG4-4)
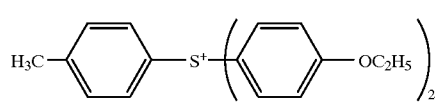
(PAG4-5)
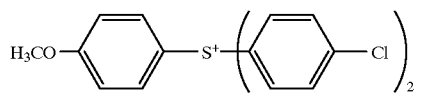
(PAG4-6)
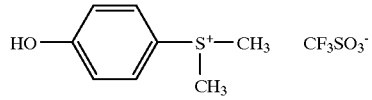
(PAG4-7)
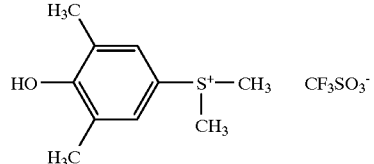
(PAG4-8)
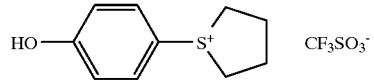
(PAG4-9)
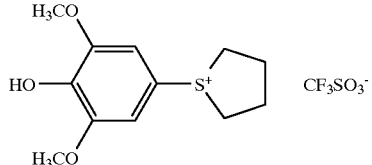
(PAG4-10)
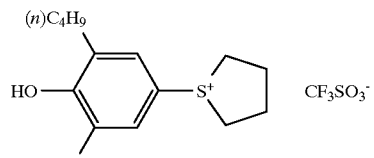
(PAG4-11)
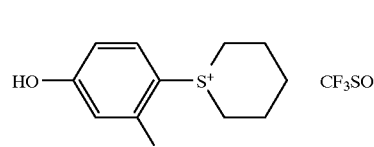
(PAG4-12)
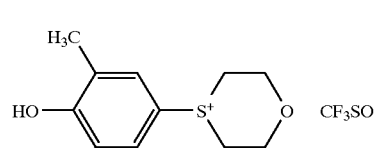
(PAG4-13)
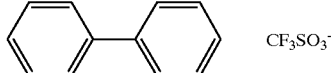
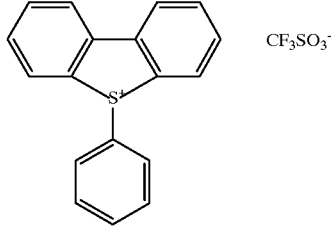
(PAG4-14)
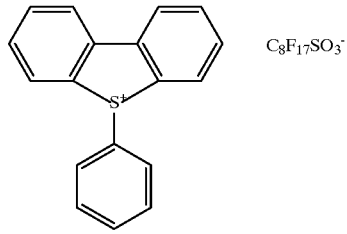
(PAG4-15)
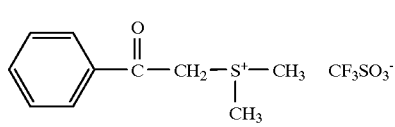
(PAG4-16)
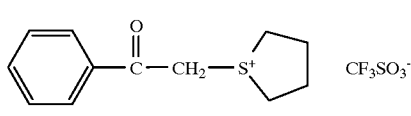
(PAG4-17)
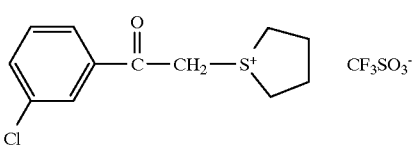
(PAG4-18)
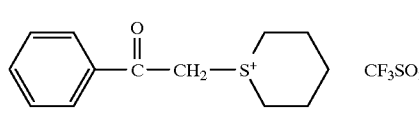
(PAG4-19)
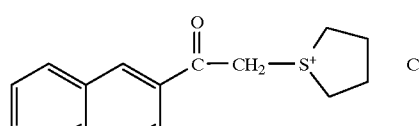
(PAG4-20)
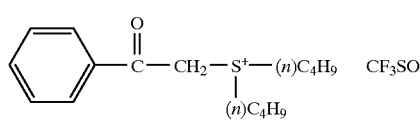

-continued

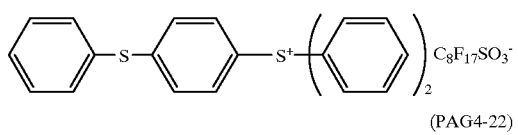 (PAG4-21)

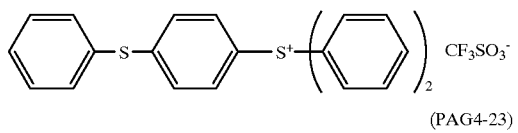 (PAG4-22)

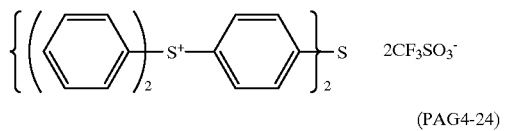 (PAG4-23)

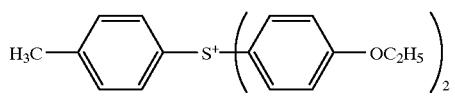 (PAG4-24)

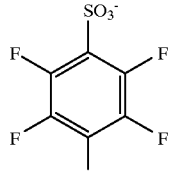

(PAG4-25)

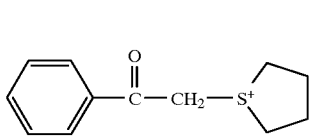 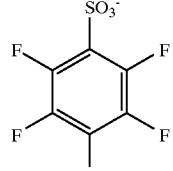

The onium salts represented by general formulae (PAG3) and (PAG4) are known. They can be synthesized, for example, by the methods described in, e.g., J. W. Knapczyk et al., *J. Am. Chem. Soc.*, 91, 145 (1969), A. L. Maycok et al., *J. Org. Chem.*, 35, 2535 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone derivatives represented by the following general formula (PAG5) and iminosulfonate derivatives represented by the following general formula (PAG6).

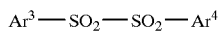 (PAG5)

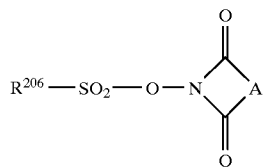 (PAG6)

In the above formulae, $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene, or arylene group.

Specific examples thereof are given below, but the compounds represented by general formula (PAG5) or (PAG6) should not be construed as being limited thereto.

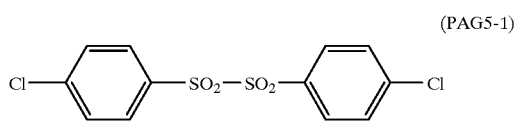 (PAG5-1)

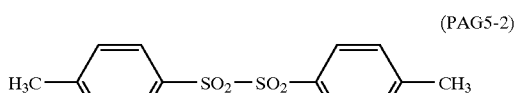 (PAG5-2)

 (PAG5-3)

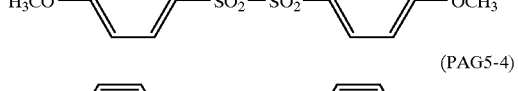 (PAG5-4)

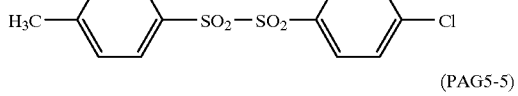 (PAG5-5)

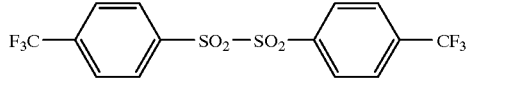 (PAG5-6)

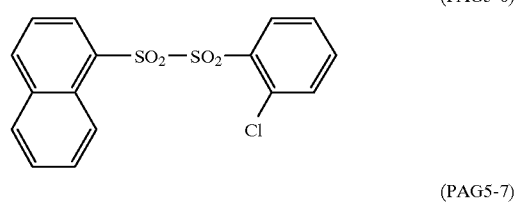 (PAG5-7)

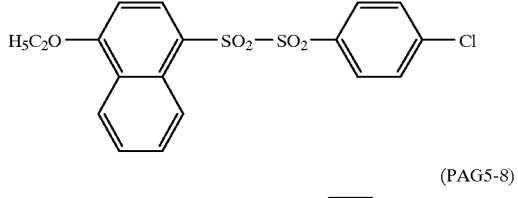 (PAG5-8)

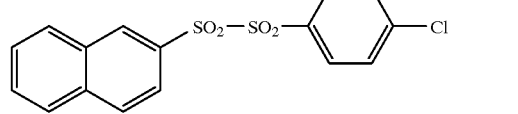 (PAG5-9)

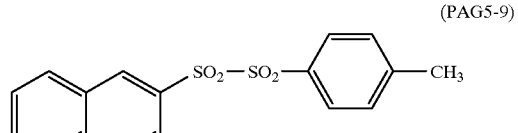 (PAG5-10)

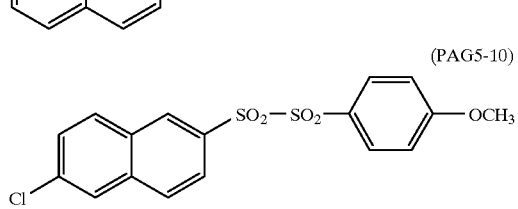

(PAG5-11)
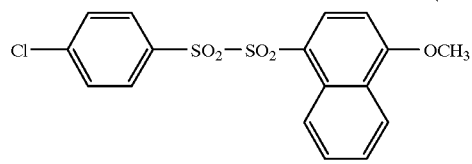
(PAG5-12)
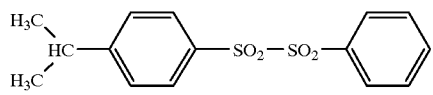
(PAG5-13)
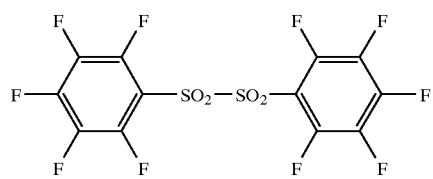
(PAG5-14)
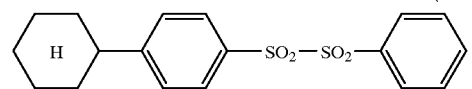
(PAG6-1)
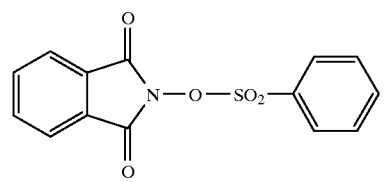
(PAG6-2)
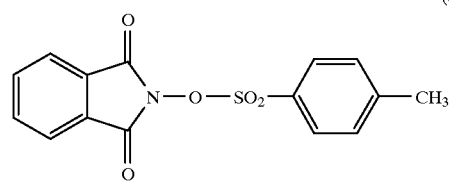
(PAG6-3)
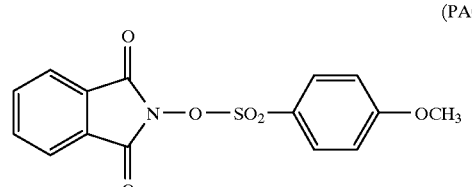
(PAG6-4)
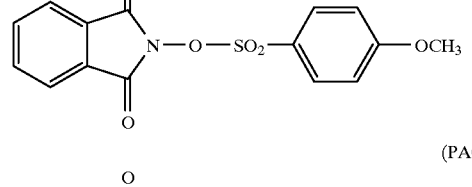
(PAG6-5)
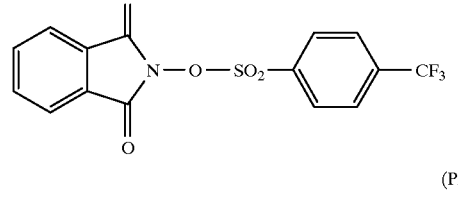
(PAG6-6)
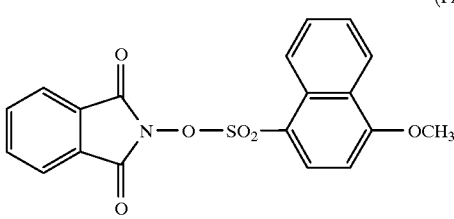
(PAG6-7)
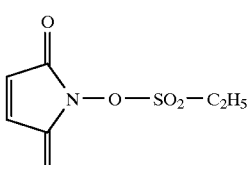
(PAG6-8)
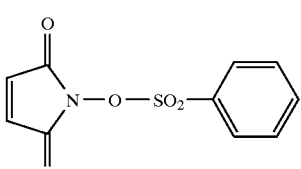
(PAG6-9)
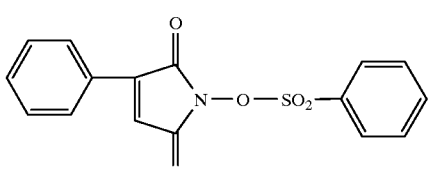
(PAG6-10)
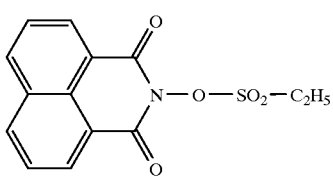
(PAG6-11)
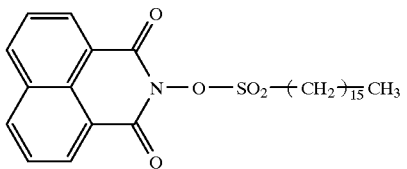
(PAG6-12)
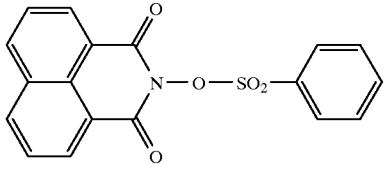
(PAG6-13)
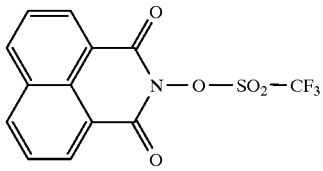

-continued

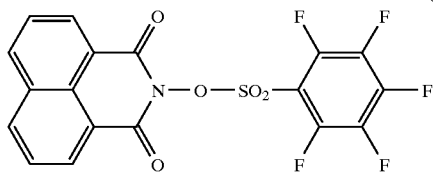
(PAG6-14)

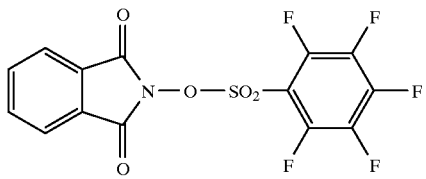
(PAG6-15)

[IIII] Resin Having Groups Decomposing by the Action of Acid to Enhance Solubility in Alkaline Developing Solution The resin which has groups decomposing by the action of an acid to enhance solubility of the resin in an alkaline developing solution and is used in the chemically amplified resist according to the present invention is a resin having acid-decomposable groups in the backbone and/or side chains thereof, preferably in side chains thereof.

The groups which is capable of decomposing by the action of an acid are preferably represented by —COOA$^0$ or —O—B$^0$. Examples of groups containing those groups include groups represented by —R$^0$—COOA$^0$ or —Ar—O—B$^0$.

A$^0$ represents —C(R$^{01}$)(R$^{02}$)(R$^{03}$), —Si(R$^{01}$)(R$^{02}$)(R$^{03}$), or —C(R$^{04}$)(R$^{05}$)—O—R$^{06}$, and B$^0$ represents —A$^0$ or —CO—O—A$^0$. (R$^0$, R$^{01}$ to R$^{06}$, and Ar have the same meanings as will be defined later.)

Desirable examples of the acid-decomposable groups include silyl ether groups, cumyl ester groups, acetal groups, tetrahydropyranyl ether groups, tetrahydropyranyl ester groups, enol ether groups, enol ester groups, tertiary alkyl ether groups, tertiary alkyl ester groups, and tertiary alkyl carbonate groups. Preferred of these are tertiary alkyl ester groups, tertiary alkyl carbonate groups, cumyl ester groups, acetal groups, and tetrahydropyranyl ether groups.

In the case where these acid-decomposable groups are bonded as side chains to a resin, this resin is an alkali-soluble resin having —OH or —COOH groups, preferably —R$^0$—COOH or —Ar—OH groups, as side chains. Examples of the alkali-soluble resin will be given later.

These alkali-soluble resins have an alkali dissolution rate of preferably 170 Å/sec or higher, more preferably 330 Å/sec or higher, as measured in 0.261 N tetramethylammonium hydroxide (TMAH) at 23° C.

Desirable from the standpoint of attaining a rectangular profile is an alkali-soluble resin having a high transmittance to far-ultraviolet or excimer laser beam. A 1 μm-thick film of the resin preferably has a transmittance of from 20 to 90% at a wavelength of 248 nm.

Especially preferred alkali-soluble resins from the above standpoint are poly(o-, m-, or p-hydroxystyrene), copolymers thereof, hydrogenated poly(hydroxystyrene)s, halogen- or alkyl-substituted poly(hydroxystyrene)s, partially O-alkylated or O-acylated poly(hydroxystyrene)s, styrene/hydroxystyrene copolymers, α-methylstyrene/hydroxystyrene copolymers, and hydrogenated novolak resins.

The resin having acid-decomposable groups for use in the present invention can be obtained by reacting an alkali-soluble resin with a precursor for acid-decomposable groups or by copolymerizing a monomer for an alkali-soluble resin which monomer has an acid-decomposable group with any of various monomers, as disclosed in, e.g., European Patent 254,853, JP-A-2-25850, JP-A-3-223860, and JP-A-4-251259.

Specific examples of the resin having acid-decomposable groups which is used in the present invention are given below, but that resin should not be construed as being limited thereto.

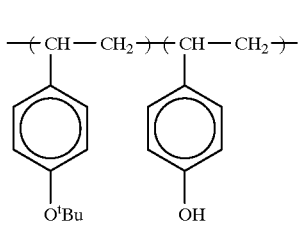
(i)

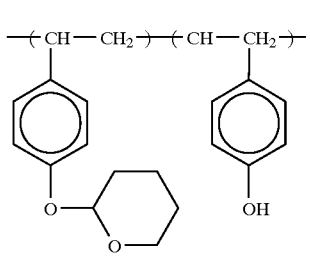
(ii)

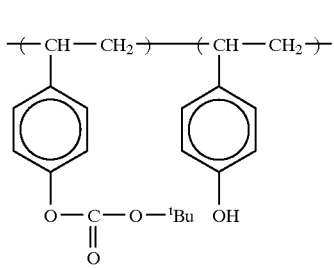
(iii)

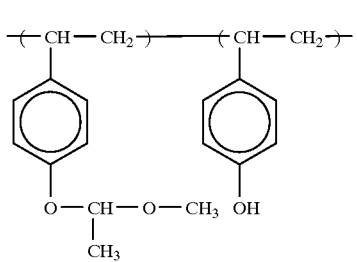
(iv)

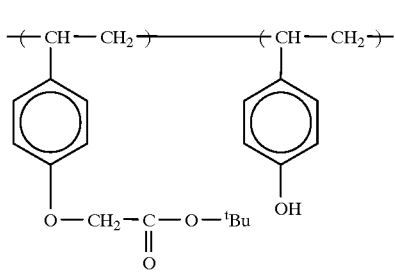
(v)

(vi)
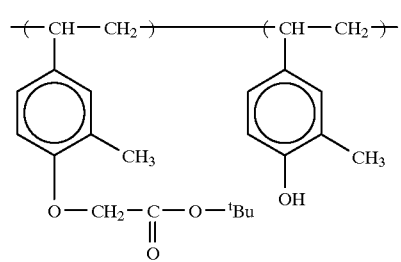
(vii)
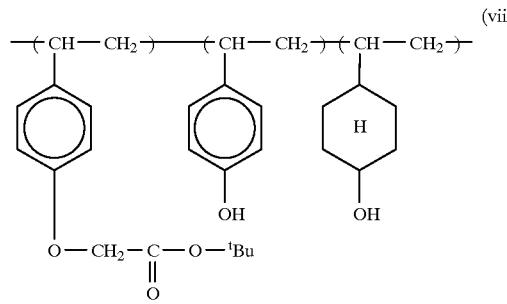
(viii)
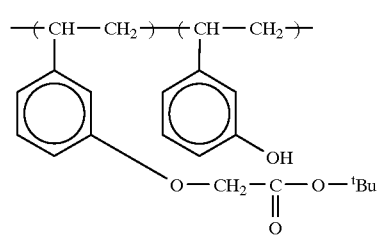
(ix)
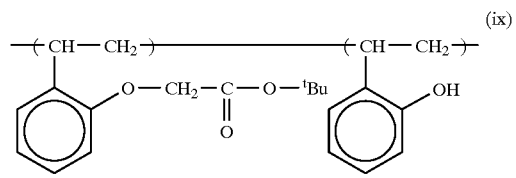
(x)
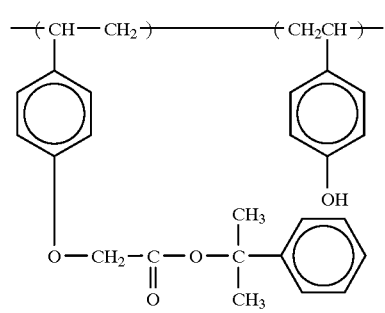
(xi)
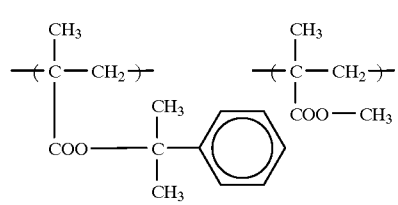
(xii)
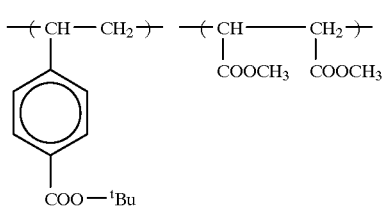
(xiii)
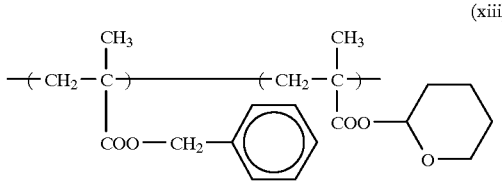
(xiv)
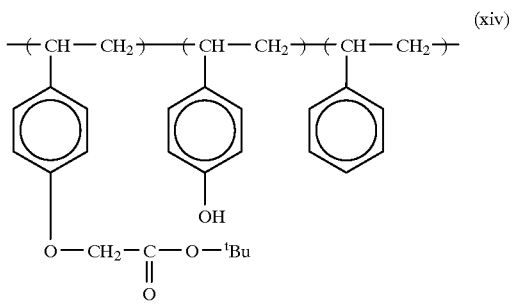
(xv)
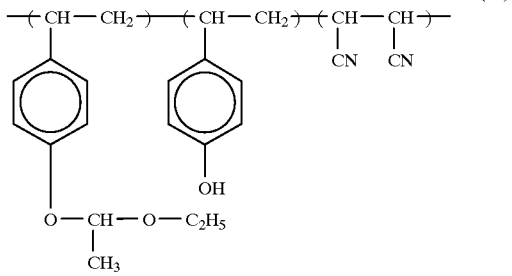
(xvi)
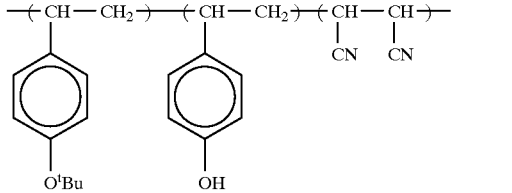
(xvii)

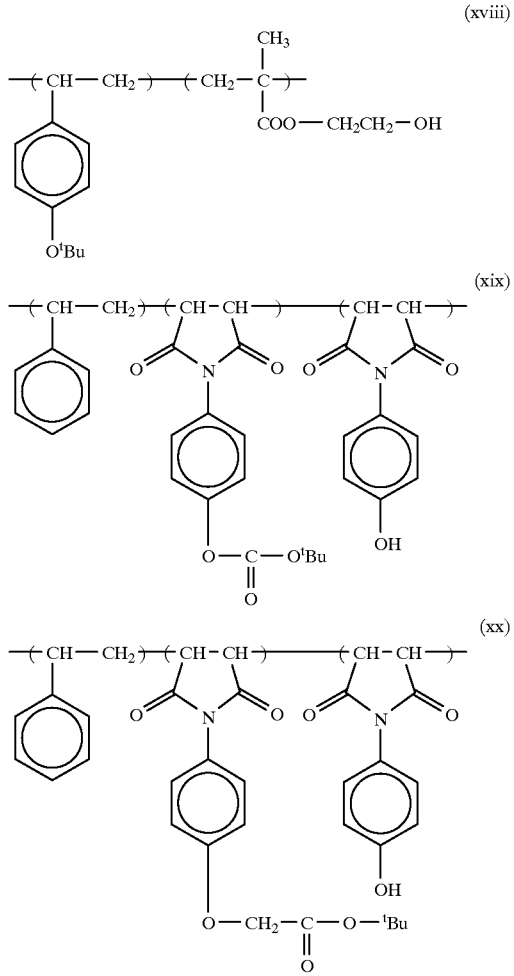

The content of acid-decomposable groups is expressed as B/(B+S), wherein B is the number of the acid-decomposable groups in the resin and S is the number of alkali-soluble groups not protected by the acid-decomposable groups. The content thereof is preferably from 0.01 to 0.5, more preferably from 0.05 to 0.40, most preferably from 0.05 to 0.30. If the value B/(B+S) is larger than 0.5, such a resin is liable to suffer film shrinkage after post-exposure bake, has insufficient substrate adhesion, and causes a scum. On the other hand, if it is smaller than 0.01, such a resin may result in a resist pattern having an extreme standing wave mark in the side walls thereof.

The weight-average molecular weight ($M_w$) of the resin having acid-decomposable groups is desirably from 2,000 to 200,000. If the $M_w$ thereof is lower than 2,000, the film reduction at unexposed parts during development is liable to be large. If the $M_w$ thereof exceeds 200,000, there is a possibility that the alkali-soluble resin itself has too low a rate of dissolution in an alkali, resulting in reduced sensitivity. The preferred range of the $M_w$ of the resin is from 5,000 to 100,000, especially from 8,000 to 50,000. The degree of dispersion ($M_w/M_n$) of the resin is preferably from 1.0 to 4.0, more preferably from 1.0 to 2.0, most preferably from 1.0 to 1.6. The lower the degree of dispersion, the better the heat resistance and image-forming properties (pattern profile, defocus latitude, etc.).

Weight-average molecular weight herein means that determined by gel permeation chromatography and reduced to polystyrene.

The resin having acid-decomposable groups, for use in the present invention, may be a mixture of two or more polymers each having acid-decomposable groups. The use amount of this resin in the present invention is generally from 40 to 99% by weight, desirably from 60 to 95% by weight, based on the total amount of the photosensitive composition (excluding the solvent). An alkali-soluble resin having no acid-decomposable groups may be further incorporated into the composition for the purpose of adjusting alkali solubility.

An acid-decomposable low-molecular dissolution inhibitive compound which will be described later is preferably used in combination with the acid generator and the resin having acid-decomposable groups.

In this case, the content of the dissolution inhibitive compound is generally from 3 to 45% by weight, preferably from 5 to 30% by weight, more preferably from 10 to 20% by weight, based on the total amount of the photosensitive composition (excluding the solvent).

[IV] Alkali-soluble Resin for Use in the Invention

A resin insoluble in water and soluble in an aqueous alkali solution (hereinafter referred to also as "alkali-soluble resin") is preferably used in the present invention.

Examples of the alkali-soluble resin for use in the present invention include novolak resins, hydrogenated novolak resins, acetone-pyrogallol resins, poly(o-hydroxystyrene), poly(m-hydroxystyrene), poly(p-hydroxystyrene), hydrogenated poly(hydroxystyrene)s, halogen- or alkyl-substituted poly(hydroxystyrene)s, hydroxystyrene/N-substituted maleimide copolymers, o/p- and m/p-hydroxystyrene copolymers, partially O-alkylated poly(hydroxystyrene)s [e.g., O-methylated, O-(1-methoxy)ethylated, O-(1-ethoxy)ethylated, O-2-tetrahydropyranylated, and O-(t-butoxycarbonyl)methylated poly(hydroxystyrene)s having a degree of substitution of from 5 to 30 mol % of the hydroxyl groups], O-acylated poly(hydroxystyrene)s [e.g., O-acetylated and O-(t-butoxy)carbonylated poly(hydroxystyrene)s having a degree of substitution of from 5 to 30 mol % of the hydroxyl groups], styrene/maleic anhydride copolymers, styrene/hydroxystyrene copolymers, α-methylstyrene/hydroxystyrene copolymers, carboxylated methacrylic resins, and derivatives thereof. However, the alkali-soluble resin for use in the present invention should not be construed as being limited to these examples.

Especially preferred alkali-soluble resins are novolak resins, poly(o-hydroxystyrene), poly(m-hydroxystyrene), poly(p-hydroxystyrene), copolymers of these hydroxystyrenes, alkyl-substituted poly(hydroxystyrene)s, partially O-alkylated or O-acylated poly(hydroxystyrene)s, styrene/hydroxystyrene copolymers, and α-methylstyrene/hydroxystyrene copolymers. The novolak resins are obtained by addition-condensing one or more given monomers as the main ingredient with one or more aldehydes in the presence of an acid catalyst.

Examples of the given monomers include hydroxylated aromatic compounds such as phenol, cresols, i.e., m-cresol, p-cresol, and o-cresol, xylenols, e.g., 2,5-xylenol, 3,5-xylenol, 3,4-xylenol, and 2,3-xylenol, alkylphenols, e.g., m-ethylphenol, p-ethylphenol, o-ethylphenol, p-t-butylphenol, p-octylphenol, and 2,3,5-trimethylphenol, alkoxyphenols, e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol, dialkylphenols, e.g., 2-methyl-4-isopropylphenol, and other hydroxylated aromatics including m-chlorophenol, p-chlorophenol, o-chlorophenol, dihydroxybiphenyl, bisphenol A, phenylphenol, resorcinol, and naphthol. These compounds may be used alone or as a mixture of two or more thereof. The main monomers for novolak resins should not be construed as being limited to the above examples.

Examples of the aldehydes include formaldehyde, paraformaldehyde, acetaldehyde, propionaldehyde, benzaldehyde, phenylacetaldehyde, α-phenylpropionaldehyde, β-phenylpropionaldehyde, o-hydroxybenzaldehyde, m-hydroxybenzaldehyde, p-hydroxybenzaldehyde, O-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetals derived from these, such as chloroacetaldehyde diethyl acetal. Preferred of these is formaldehyde.

These aldehydes may be used alone or in combination of two or more thereof. Examples of the acid catalyst include hydrochloric acid, sulfuric acid, formic acid, acetic acid, and oxalic acid.

The weight-average molecular weight of the thus-obtained novolak resin is desirably from 1,000 to 30,000. If the weight-average molecular weight thereof is lower than 1,000, the film reduction at unexposed parts during development is liable to be large. If the weight-average molecular weight thereof exceeds 30,000, the developing rate may be too low. The especially preferred range of the molecular weight of the novolak resin is from 2,000 to 20,000.

The poly(hydroxystyrene)s and derivatives and copolymers thereof shown above as alkali-soluble resins other than novolak resins each has a weight-average molecular weight of 2,000 or higher, preferably from 5,000 to 200,000, more preferably from 10,000 to 100,000. From the standpoint of obtaining a resist film having improved heat resistance, the weight-average molecular weight thereof is desirably 25,000 or higher.

Weight-average molecular weight herein means that determined by gel permeation chromatography and calculated for standard polystyrene.

In the present invention, those alkali-soluble resins may be used as a mixture of two or more thereof. Use amount of the alkali-soluble resins is generally from 40 to 97% by weight, desirably from 60 to 90% by weight, based on the total amount of the photosensitive composition (excluding the solvent).

[V] Low-molecular Acid-decomposable Dissolution Inhibitive Compound for Use in the Invention A low-molecular acid-decomposable dissolution inhibitive compound is preferably used in the present invention.

The acid-decomposable dissolution inhibitive compound for use in the present invention is a compound which has at least two acid-decomposable groups in the molecular structure and in which the two acid-decomposable groups most apart from each other are separated by at least 8 bonding atoms.

In the present invention, the acid-decomposable dissolution inhibitive compound is desirably either a compound which has at least two acid-decomposable groups in the molecular structure and in which the two acid-decomposable groups most apart from each other are separated by at least 10, preferably at least 11, more preferably at least 12 bonding atoms, or a compound which has at least three acid-decomposable groups and in which the two acid-decomposable groups most apart from each other are separated by at least 9, preferably at least 10, more preferably at least 11 bonding atoms. The upper limit of the bonding atoms by which the two acid-decomposable groups most apart from each other are separated is preferably 50, more preferably 30.

In the case where the acid-decomposable dissolution inhibitive compound has three or more, desirably four or more acid-decomposable groups, the compound exhibits an extremely improved dissolution inhibiting effect on the alkali-soluble resin when the acid-decomposable groups are apart from each other at least at a given distance. This is true also in the case where the acid-decomposable dissolution inhibitive compound has two acid-decomposable groups.

The distance between acid-decomposable groups in the present invention is expressed in terms of the number of bonding atoms present between the groups, excluding the atoms contained in the groups. For example, in each of compounds (1) and (2) shown below, the distance between acid-decomposable groups is 4 bonding atoms. In compound (3), that distance is 12 bonding atoms.

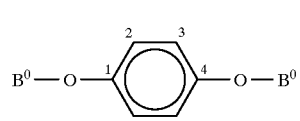

(1)

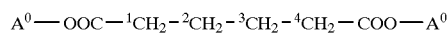

(2)

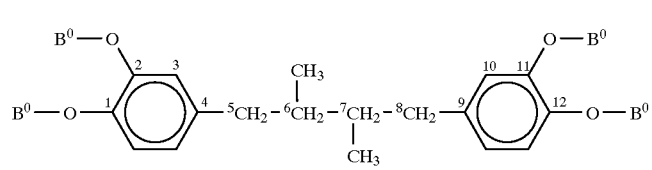

(3)

acid-decomposable group: —COO—A⁰, —O—B⁰

Although the acid-decomposable dissolution inhibitive compound for use in the present invention may have two or more acid-decomposable groups on the same benzene ring, it is preferably a compound having a framework in which each benzene ring does not have more than one acid-decomposable group. The molecular weight of the acid-decomposable dissolution inhibitive compound for use in the present invention is 3,000 or lower, preferably from 500 to 3,000, more preferably from 1,000 to 2,500.

In a preferred embodiment of the present invention, examples of groups containing an acid-decomposable group, i.e., —COO—A° or —O—B°, include groups represented by —R°—COO—A° or —Ar—O—B°.

In the above formulae, A° represents —C($R^{01}$)($R^{02}$)($R^{03}$), —Si($R^{01}$)($R^{02}$)($R^{03}$), or —C($R^{04}$)($R^{05}$)—O—$R^{06}$, and B° represents A° or —CO—O—A°.

$R^{01}$, $R^{02}$, $R^{03}$, $R^{04}$, and $R^{05}$ may be the same or different and each represents a hydrogen atom, an alkyl group, a cycloalkyl group, an alkenyl group, or an aryl group, and $R^{06}$ represents an alkyl group or an aryl group, provided that at least two of $R^{01}$ to $R^{03}$ are not hydrogen atoms, and that two of $R^{01}$ to $R^{03}$ or two of $R^{04}$ to $R^{06}$ may be bonded to each other to form a ring. R° represents an optionally substituted, aliphatic or aromatic hydrocarbon group having a valence of 2 or higher, and —Ar— represents an optionally substituted, mono- or polycyclic aromatic group having a valence of 2 or higher.

The alkyl group is preferably one having 1 to 4 carbon atoms, such as methyl, ethyl, propyl, n-butyl, sec-butyl, or t-butyl. The cycloalkyl group is preferably one having 3 to 10 carbon atoms, such as cyclopropyl, cyclobutyl, cyclohexyl, or adamantyl. The alkenyl group is preferably one having 2 to 4 carbon atoms, such as vinyl, propenyl, allyl, or butenyl. The aryl group is preferably one having 6 to 14 carbon atoms, such as phenyl, xylyl, toluyl, cumenyl, naphthyl, or anthracenyl.

Examples of the substituents include hydroxy, halogen atoms (fluorine, chlorine, bromine, and iodine), nitro, cyano, the alkyl groups enumerated above, alkoxy groups such as methoxy, ethoxy, hydroxyethoxy, propoxy, hydroxypropoxy, n-butoxy, isobutoxy, sec-butoxy, and t-butoxy, alkoxycarbonyl groups such as methoxycarbonyl and ethoxycarbonyl, aralkyl groups such as benzyl, phenethyl, and cumyl, aralkyloxy groups, acyl groups such as formyl, acetyl, butyryl, benzoyl, cyanamyl, and valeryl, acyloxy groups such as butyryloxy, the alkenyl groups enumerated above, alkenyloxy groups such as vinyloxy, propenyloxy, allyloxy, and butenyloxy, the aryl groups enumerated above, aryloxy groups such as phenoxy, and aryloxycarbonyl groups such as benzoyloxy.

Desirable examples of the acid-decomposable groups include silyl ether groups, cumyl ester groups, acetal groups, tetrahydropyranyl ether groups, enol ether groups, enol ester groups, tertiary alkyl ether groups, tertiary alkyl ester groups, and tertiary alkyl carbonate groups. Preferred of these are tertiary alkyl ester groups, tertiary alkyl carbonate groups, cumyl ester groups, and tetrahydropyranyl ether groups.

Desirable acid-decomposable dissolution inhibitive compounds include compounds obtained from the polyhydroxy compounds given in the patent documents specified below by protecting part or all of the phenolic OH groups by bonding thereto protective groups shown above, i.e., groups represented by —R°—COO—A° or B°; the patent documents include JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, and Japanese Patent Applications Nos. 3-33229, 3-230790, 3-320438, 4-25157, 4-52732, 4-103215, 4-104542, 4-107885, 4-107889 and 4-152195.

Preferred of these are the compounds obtained from the polyhydroxy compounds given in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, Japanese Patent Applications Nos. 4-25157, 4-103215, 4-104542, 4-107885, 4-107889, and 4-152195.

Specifically, such aciid-decomposable dissolution inhibitive compounds are represented by general formulae [I] to [XVI].

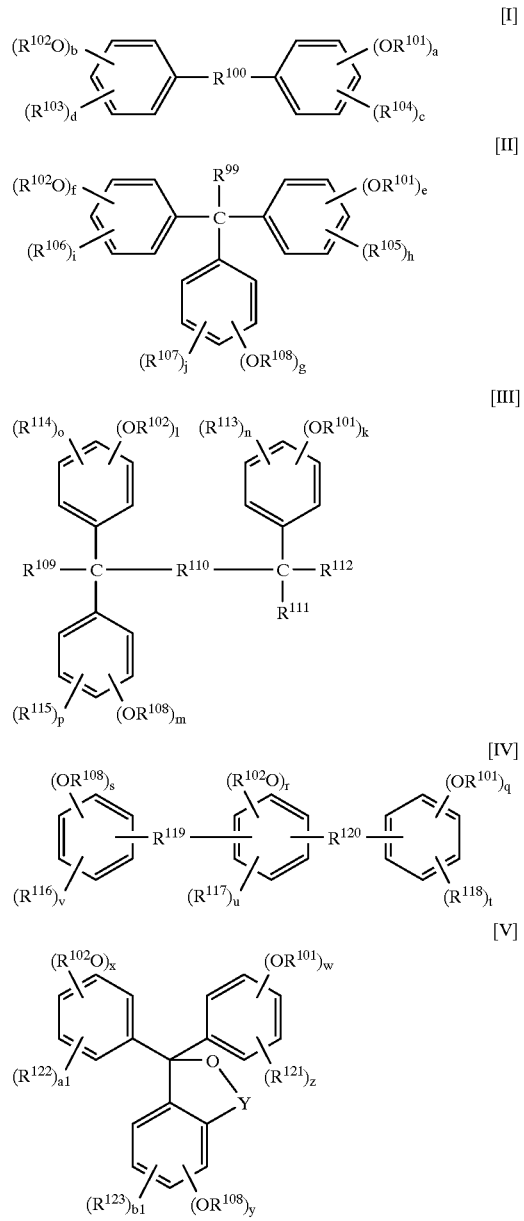

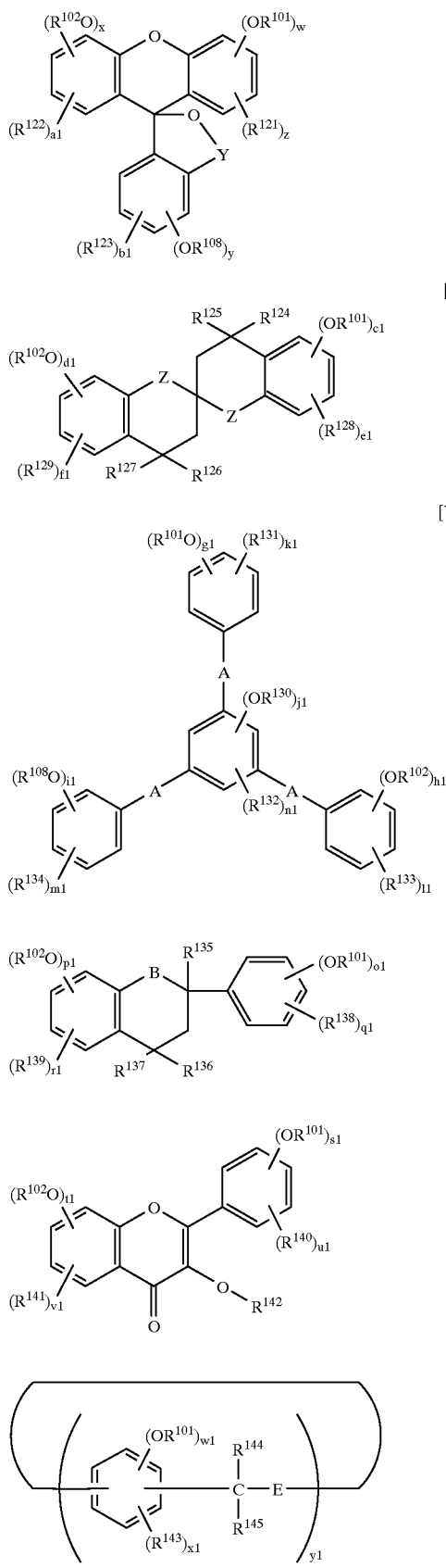

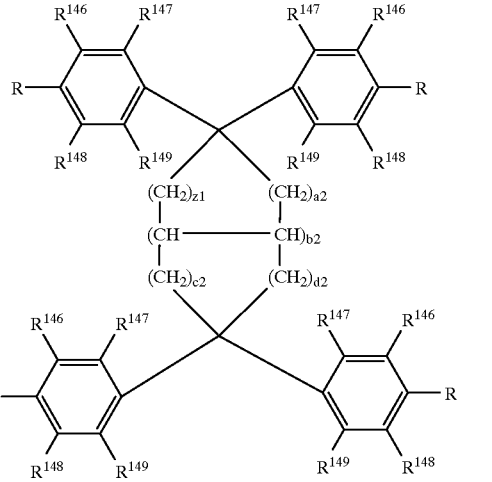

In the above formulae, $R^{101}$, $R^{102}$, $R^{108}$, and $R^{130}$ may be the same or different and each represents a hydrogen atom, $-R^0-COO-C(R^{01})(R^{02})(R^{03})$, or $-CO-O-C(R^{01})(R^{02})(R^{03})$, wherein $R^0$, $R^{01}$, $R^{02}$, and $R^{03}$ have the same meanings as defined hereinabove;

$R^{100}$ represents $-CO-$, $-COO-$, $-NHCONH-$, $-NHCOO-$, $-O-$, $-S-$, $-SO-$, $-SO_2-$, $-SO_3-$, or a group represented by

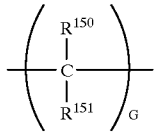

where

G is 2 to 6, provided that when G is 2, at least either of $R^{150}$ and $R^{151}$ is an alkyl group, $R^{150}$ and $R^{151}$ may be the same or different and each represents a hydrogen atom, an alkyl group, an alkoxy group, $-OH$, $-COOH$, $-CN$, a halogen atom, $-R^{152}-COOR^{153}$, or $-R^{154}-OH$, $R^{152}$ and $R^{154}$ each represents an alkylene group, and $R^{153}$ represents a hydrogen atom, an alkyl group, an aryl group, or an aralkyl group;

$R^{99}$, $R^{103}$ to $R^{107}$, $R^{109}$, $R^{111}$ to $R^{118}$, $R^{121}$ to $R^{123}$, $R^{128}$ to $R^{129}$, $R^{131}$ to $R^{134}$, $R^{138}$ to $R^{141}$, and $R^{143}$ may be the same or different and each represents a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group, or $-N(R^{155})(R^{156})$ (where $R^{155}$ and $R^{156}$ each represents H, an alkyl group, or an aryl group);

$R^{110}$ represents a single bond, an alkylene group, or a group represented by

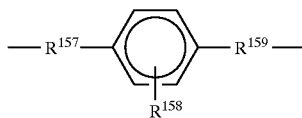

where $R^{157}$ and $R^{159}$ may be the same or different and each represents a single bond, an alkylene group, —O—, —S—, —CO—, or a carboxyl group, and $R^{158}$ represents a hydrogen atom, an alkyl group, an alkoxy group, an acyl group, an acyloxy group, an aryl group, a nitro group, a hydroxyl group, a cyano group, or a carboxyl group, provided that each hydroxyl group may be replaced by an acid-decomposable group (e.g., t-butoxycarbonylmethyl, tetrahydropyranyl, 1-ethoxy-1-ethyl, or 1-t-butoxy-1-ethyl);

$R^{119}$ and $R^{120}$ may be the same or different and each represents a methylene group, a lower-alkyl-substituted methylene group, a halomethylene group, or a haloalkyl group, provided that the term "lower alkyl" herein means an alkyl group having 1 to 4 carbon atoms;

$R^{124}$ to $R^{127}$ may be the same or different and each represents a hydrogen atom or an alkyl group;

$R^{135}$ to $R^{137}$ may be the same or different and each represents a hydrogen atom, an alkyl group, an alkoxy group, an acyl group, or an acyloxy group;

$R^{142}$ represents a hydrogen atom, —R°—COO—C($R^{O1}$)($R^{O2}$)($R^{O3}$), —CO—O—C($R^{O1}$)($R^{O2}$)($R^{O3}$), or the group represented by

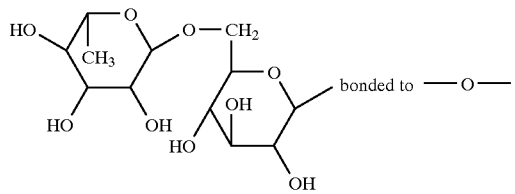

bonded to —O—

$R^{144}$ and $R^{145}$ may be the same or different and each represents a hydrogen atom, a lower alkyl group, a lower haloalkyl group, or an aryl group;

$R^{146}$ to $R^{149}$ may be the same or different and each represents a hydrogen atom, a hydroxyl group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group, or an aryloxycarbonyl group, provided that the four groups represented by the same symbol need not be the same;

Y represents —CO— or —SO$_2$—;

Z and B each represents a single bond or —O—;

A represents a methylene group, a lower-alkyl-substituted methylene group, a halomethylene group, or a haloalkyl group;

E represents a single bond or an oxymethylene group;

when any of a to z and a1 to y1 is 2 or a larger integer, the groups in the parentheses may be the same or different;

a to q, s, t, v, g1 to i1, k1 to m1, o1, q1, s1, and u1 each represents 0 or an integer of 1 to 5;

r, u, w, x, y, z, a1 to f1, p1, r1, t1, and v1 to x1 each represents 0 or an integer of 1 to 4;

j1, n1, z1, a2, b2, c2, and d2 each represents 0 or an integer of 1 to 3;

at least one of z1, a2, c2, and d2 is 1 or larger;

y1 is an integer of 3 to 8;

(a+b), (e+f+g), (k+l+m), (q+r+s), (w+x+y), (c1+d1), (g1+h1+i1+j1), (o1+p1), and (s1+t1) each is 2 or larger;

(j1+n1) is 3 or smaller;

(r+u), (w+z), (x+a1), (y+b1), (c1+e1), (d1+f1), (p1+r1), (t1+v1), and (x1+w1) each is 4 or smaller, provided that in general formula [V], (w+z) and (x+a1) each is 5 or smaller; and (a+c), (b+d), (e+h), (f+i), (g+j), (k+n), (l+o), (m+p), (q+t), (s+v), (g1+k1), (h1+l1), (i1+m1), (o1+q1), and (s1+u1) each is 5 or smaller.

(XIII)

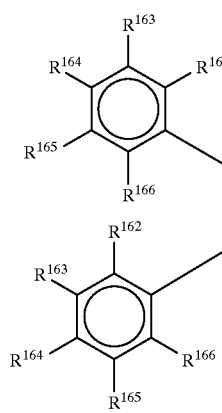 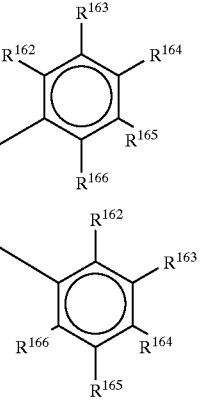

In formula (XIII), $R^{160}$ represents an organic group, a single bond, —S—, —SO—, or

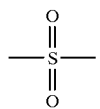

$R^{161}$ represents a hydrogen atom, a monovalent organic group, or a group represented by

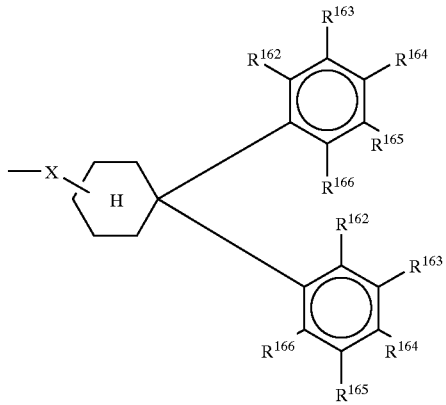

where $R^{162}$ to $R^{166}$ may be the same or different and each represents a hydrogen atom, a hydroxyl group, a halogen atom, an alkyl group, an alkoxy group, an alkenyl group, —O—R⁰—COO—C($R^{01}$)($R^{02}$)($R^{03}$), or —O—CO—O—C($R^{01}$)($R^{02}$)($R^{03}$), provided that at least two of $R^{162}$ to $R^{166}$ are —O—R⁰—COO—C($R^{01}$)($R^{02}$)($R^{03}$) or —O—CO—O—C($R^{01}$)($R^{02}$)($R^{03}$), and that the four or six substituents represented by the same symbol need not be the same, and X represents a divalent organic group; and e2 represents 0 or 1.

In formula (XIV), $R^{167}$ to $R^{170}$ may be the same or different and each represents a hydrogen atom, a hydroxyl group, a halogen atom, an alkyl group, an alkoxy group, or an alkenyl group, provided that the four to six substituents represented by the same symbol need not be the same;

$R^{171}$ and $R^{172}$ each represents a hydrogen atom, an alkyl group, or a group represented by

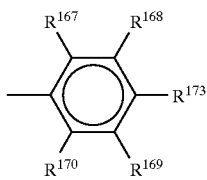

at least two of $R^{173}$'s each represents —O—R⁰—COO—C($R^{01}$)($R^{02}$)($R^{03}$) or —O—CO—O—C($R^{01}$)($R^{02}$)($R^{03}$), and the remainder each represents a hydroxyl group;

f2 and h2 each represents 0 or 1; and (XIV)

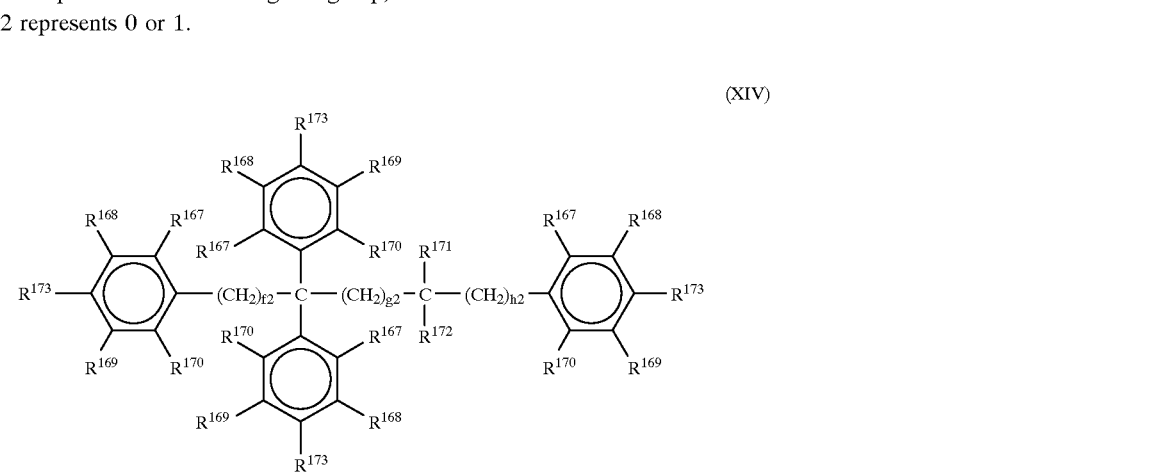

g2 represents 0 or an integer of 1 to 4.

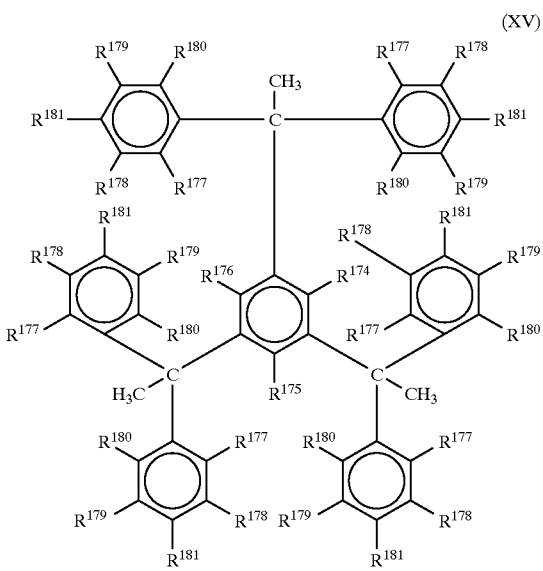

In formula (XV),
R$^{174}$ to R$^{180}$ may be the same or different and each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aralkyloxy group, or an aryloxy group, provided that the six substituents represented by the same symbol need not be the same; and at least two of R$^{181}$'s each represents —O—R$^{0}$—COO—C(R$^{01}$)(R$^{02}$)(R$^{03}$) or —O—CO—O—C(R$^{01}$)(R$^{02}$)(R$^{03}$), and the remainder each represents a hydroxyl group.

In formula (XVI),
R$^{182}$ represents a hydrogen atom or an alkyl group, provided that the atoms or groups represented by R$^{182}$ need not be the same;

R$^{183}$ to R$^{186}$ each represents a hydroxyl group, a hydrogen atom, a halogen atom, an alkyl group, or an alkoxy group, provided that the three substituents represented by the same symbol need not be the same; and at least two of R$^{187}$'s each represents —O—R$^{0}$—COO—C(R$^{01}$)(R$^{02}$)(R$^{03}$) or —O—CO—O—C(R$^{01}$)(R$^{02}$)(R$^{03}$), and the remainder each represents a hydroxyl group.

Specific examples of the frameworks of preferred compounds are shown below.

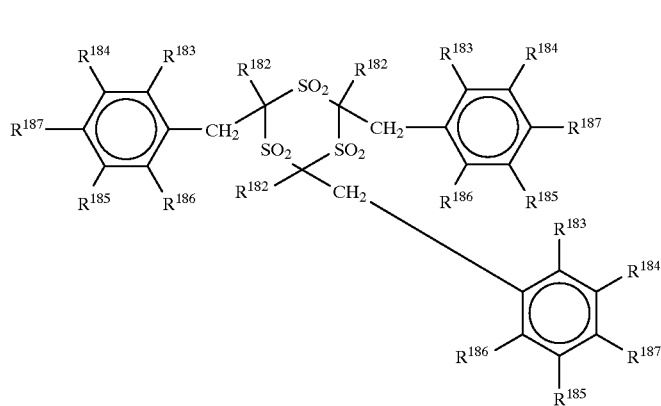

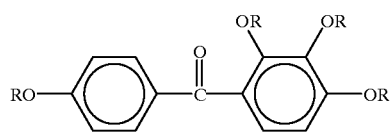
(1)
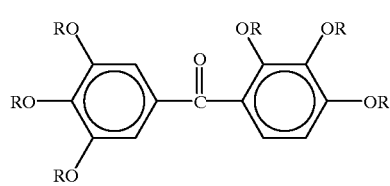
(2)
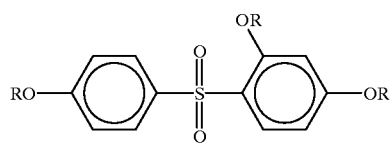
(3)
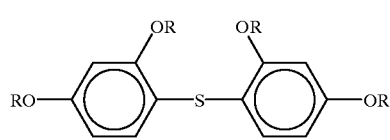
(4)
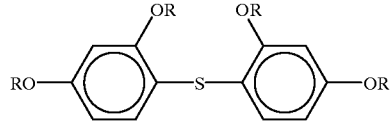
(5)
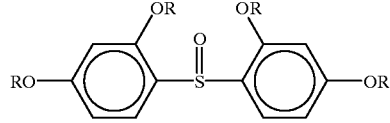
(6)
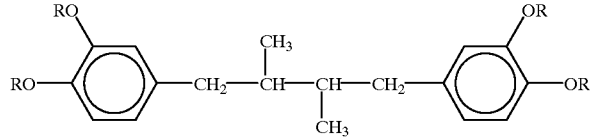
(7)
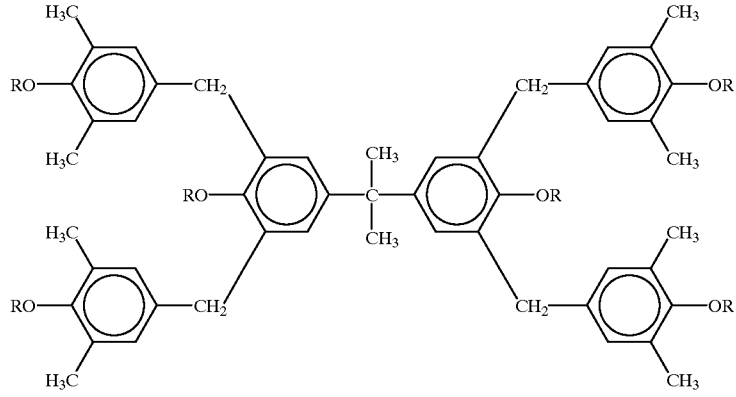
(8)
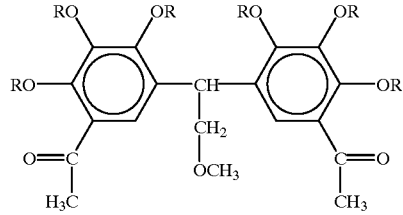

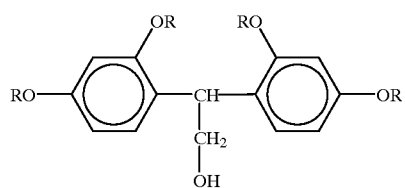
(9)
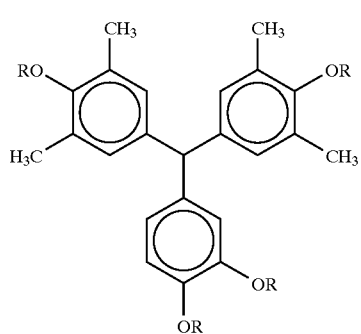
(10)
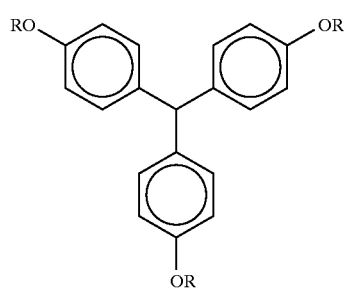
(11)
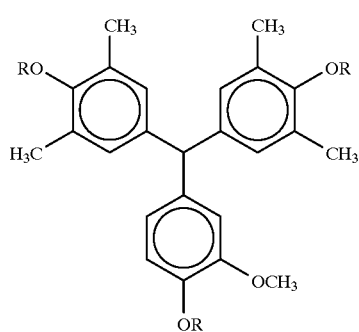
(12)
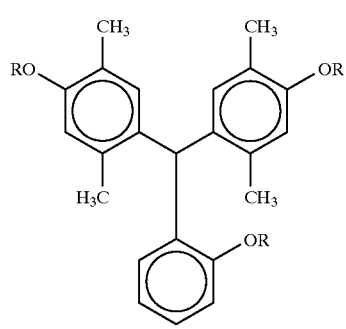
(13)

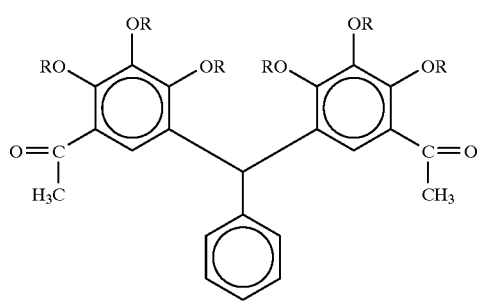
(14)
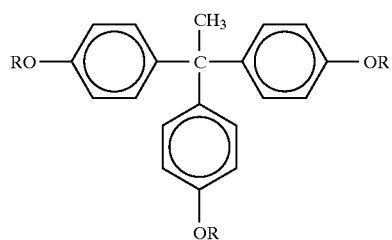
(15)
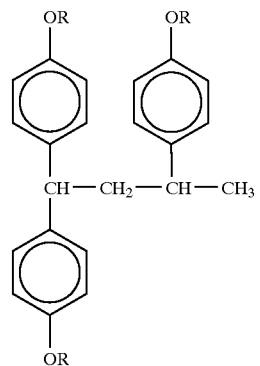
(16)
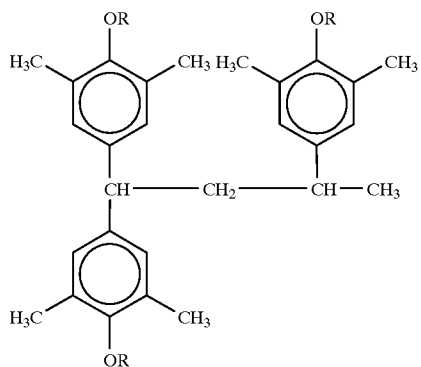
(17)

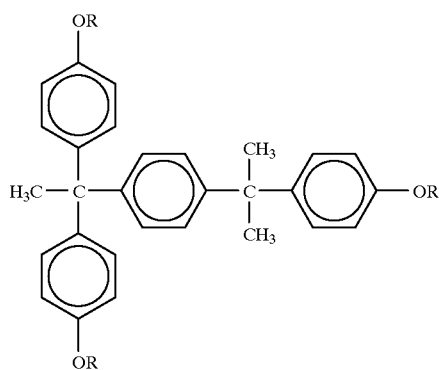
(18)
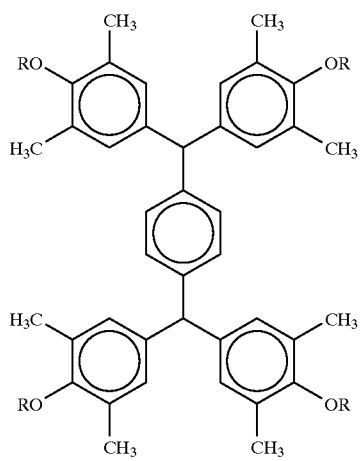
(19)
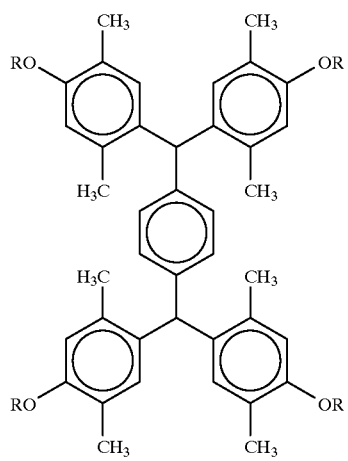
(20)
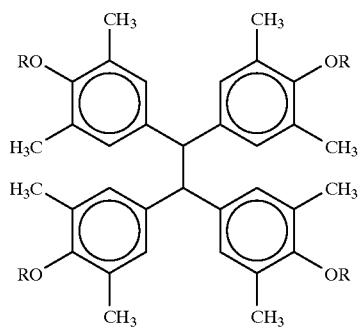
(21)

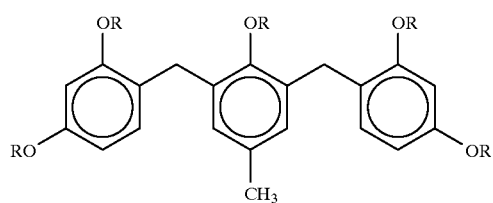
(22)
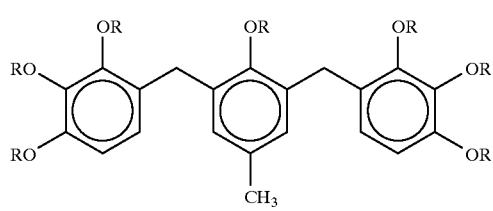
(23)
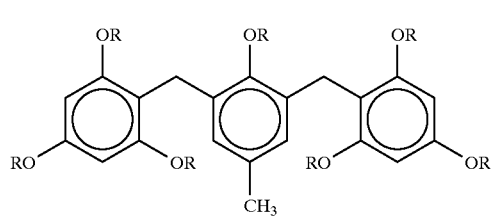
(24)
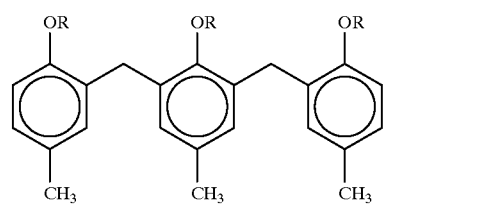
(25)
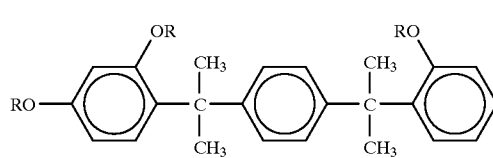
(26)
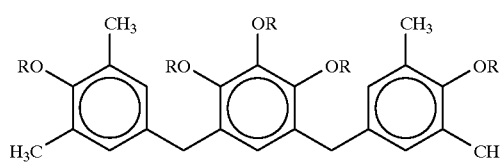
(27)
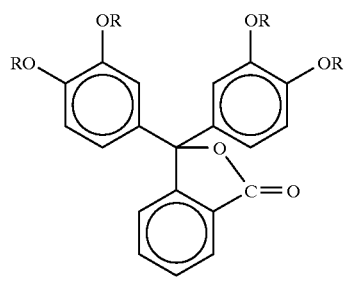
(28)

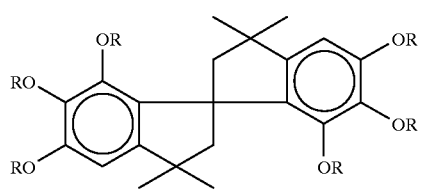
(29)
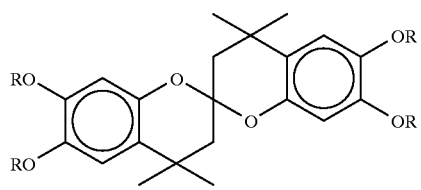
(30)
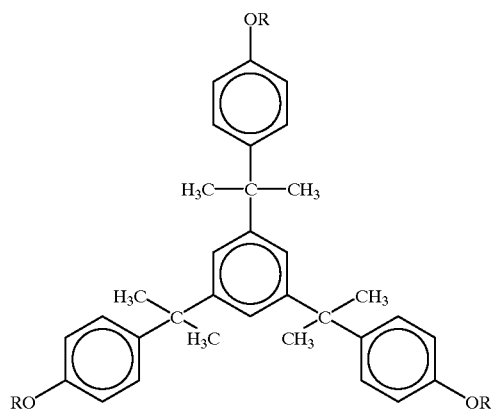
(31)
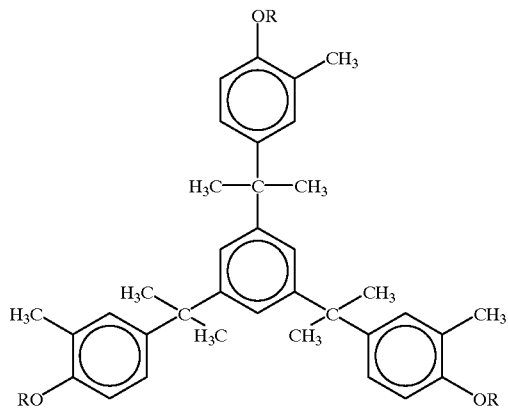
(32)

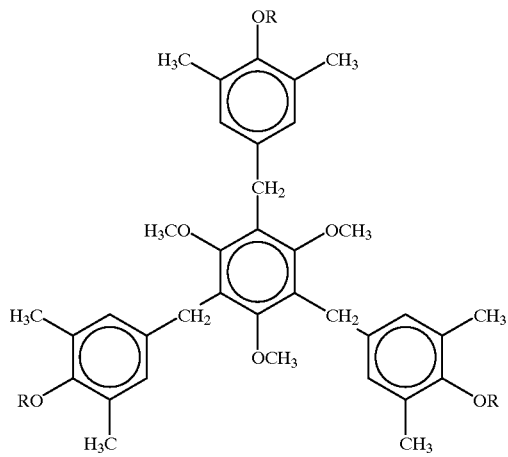
(33)
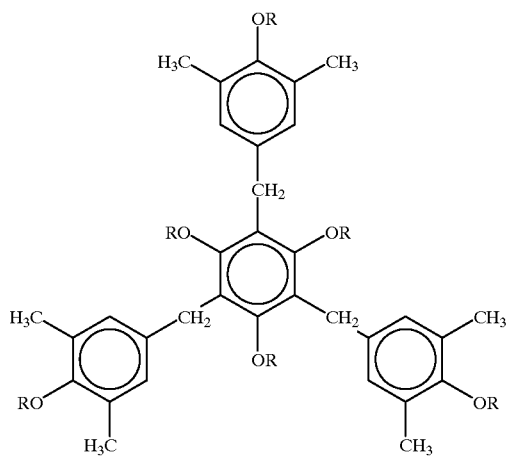
(34)
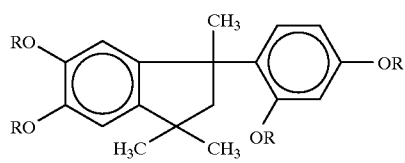
(35)
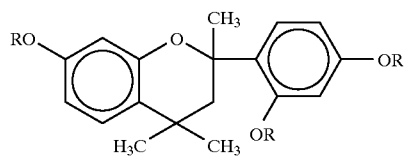
(36)
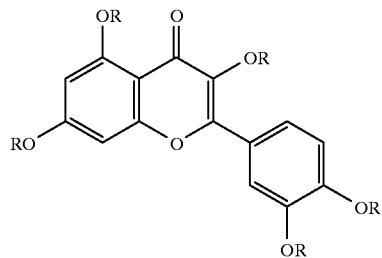
(37)

(38)
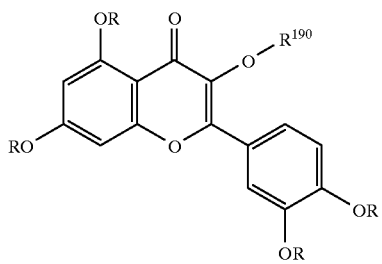
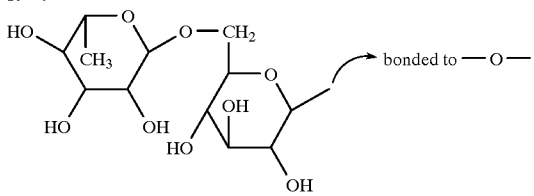
(39)
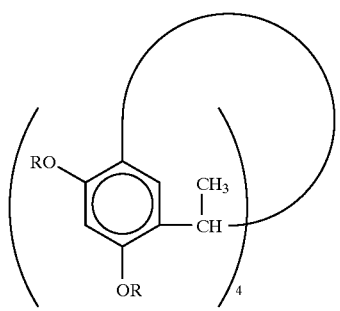
(40)
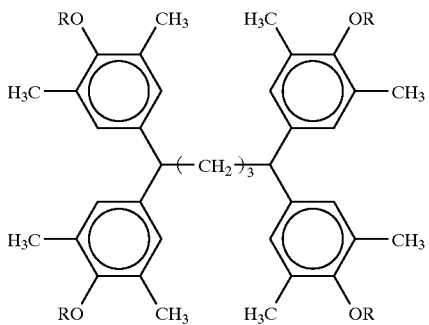
(41)
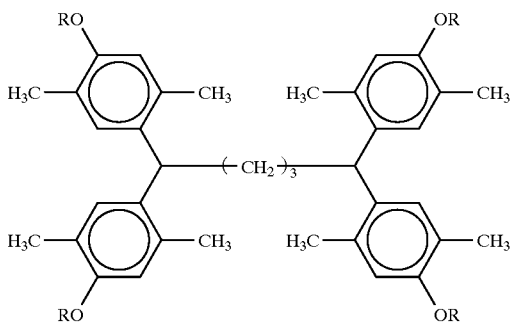

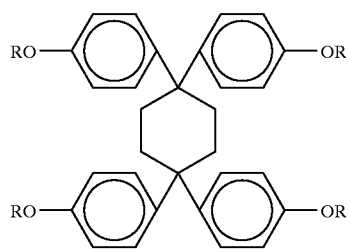
(42)
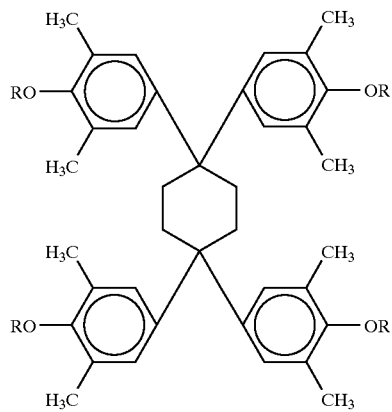
(43)
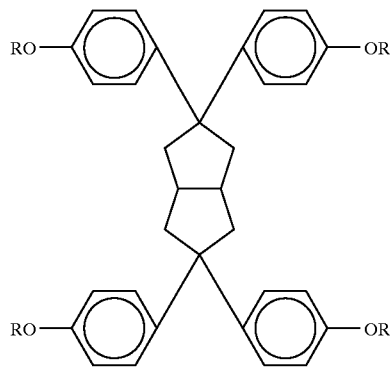
(44)
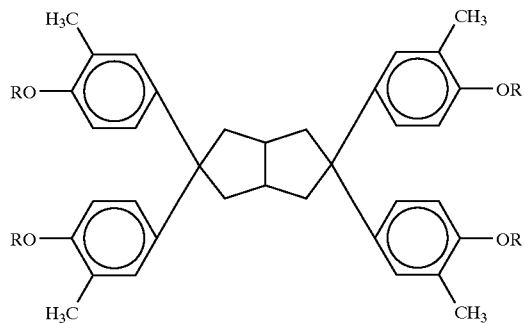
(45)

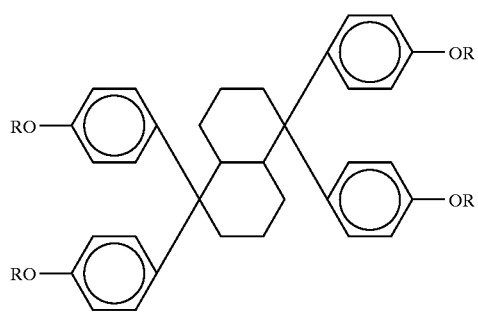
(46)
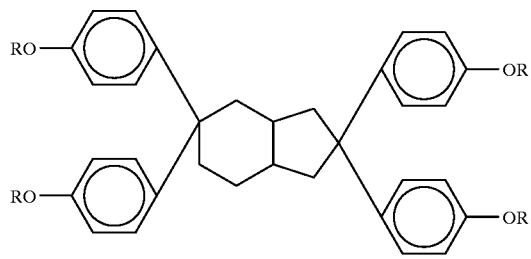
(47)
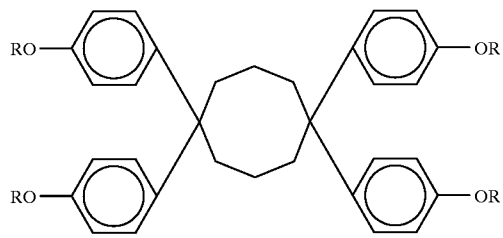
(48)
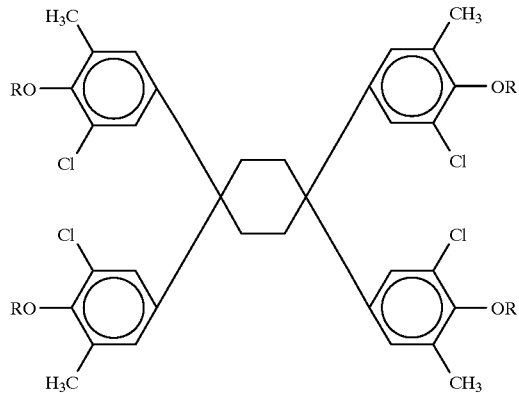
(49)
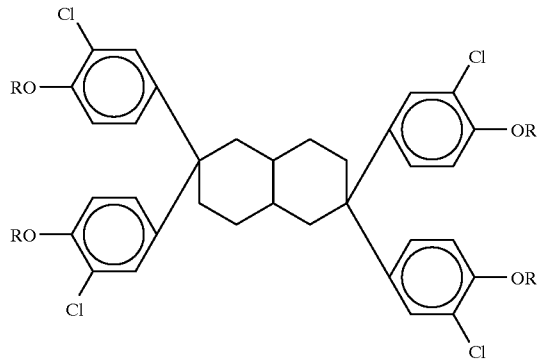
(50)

-continued
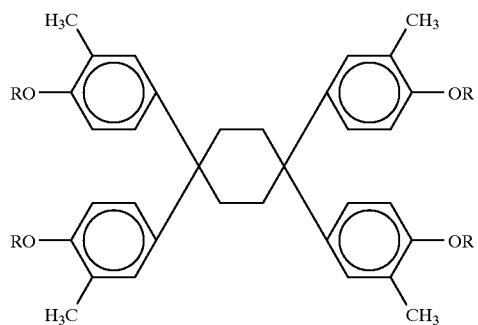
(51)
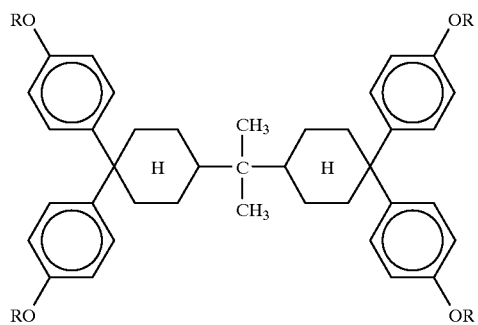
(52)
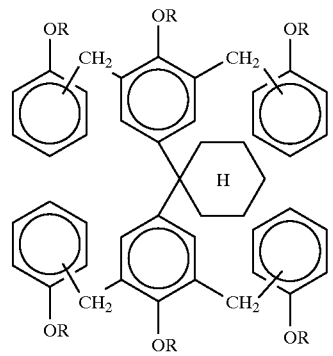
(53)
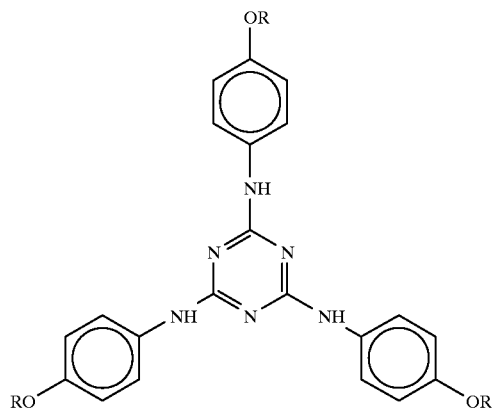
(54)

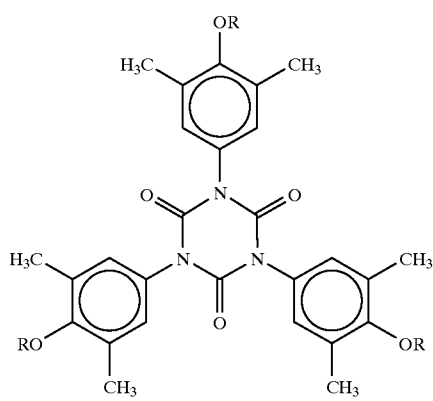
(55)
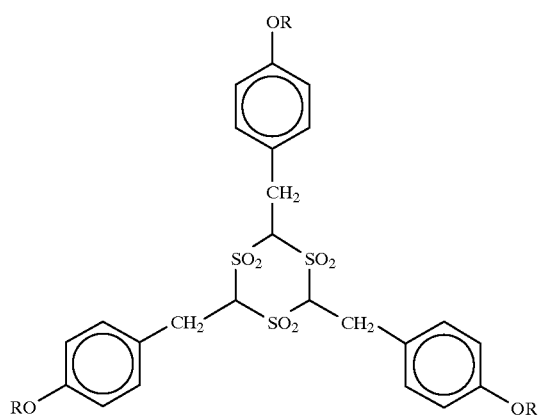
(56)
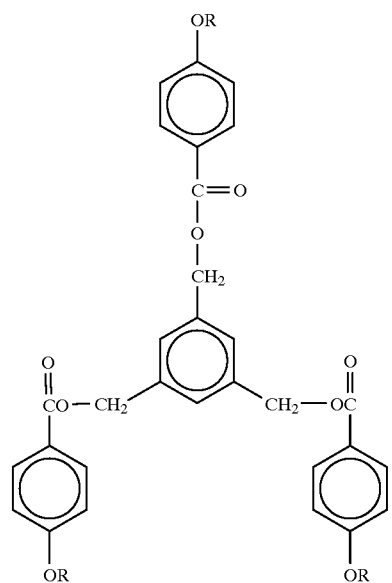
(57)

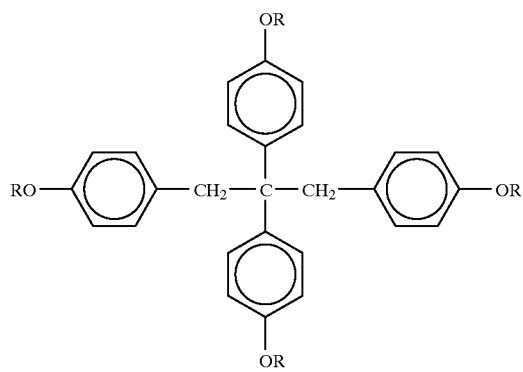
(58)
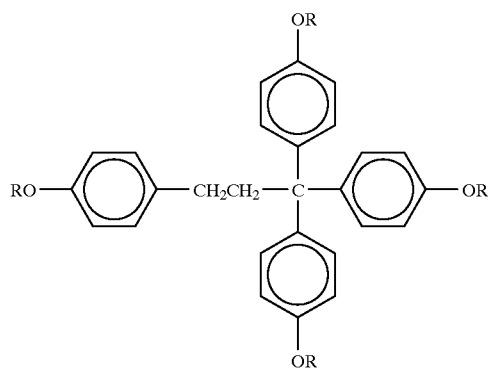
(59)
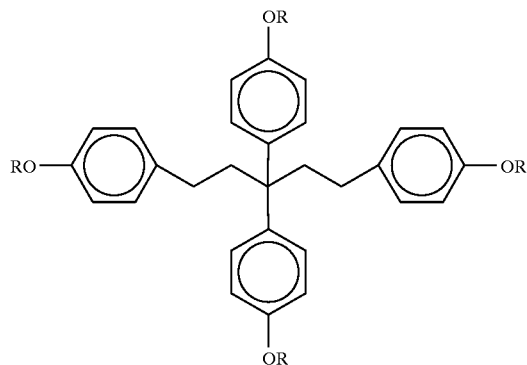
(60)
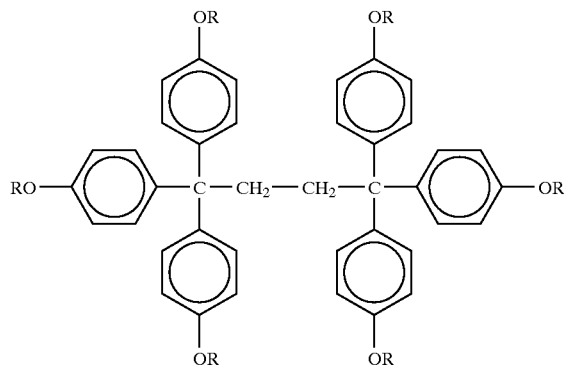
(61)

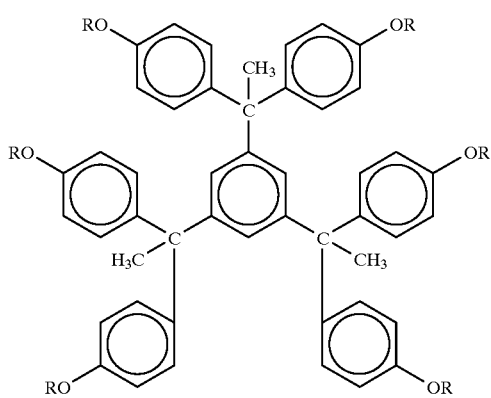

(62)

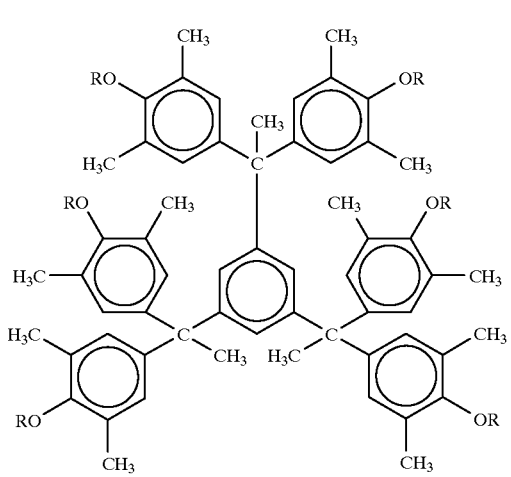

(63)

In Compounds (1) to (63), R represents a hydrogen atom, —CH$_2$—COO—C(CH$_3$)$_2$C$_6$H$_5$, —CH$_2$—COO—C$_4$H$_9'$, —COO—C$_4$H$_9'$, or the group represented by

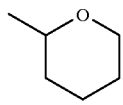

provided that at least two or, depending on the structure, at least three of R's are not hydrogen atoms, and that the substituents represented by R need not be the same.

In the case where the dissolution inhibitive compound described above is used in the present invention in combination with the acid generator compound and the alkali-soluble resin, the addition amount of the dissolution inhibitive compound is generally from 3 to 50% by weight, preferably from 5 to 40% by weight, more preferably from 10 to 35% by weight, based on the total amount of the photosensitive composition (excluding the solvent).

[VII] Other Ingredients Usable in the Invention

The photosensitive composition of the present invention may optionally further contain other ingredients such as, e.g., dyes, pigments, plasticizers, surfactants, photosensitizers, organic basic compounds, and compounds having two or more phenolic OH groups capable of accelerating dissolution into a developing solution.

The compounds having two or more phenolic OH groups usable in the present invention are preferably phenolic compounds having a molecular weight of 1,000 or lower. These compounds each should have at least two phenolic hydroxyl groups per molecule. However, if the number of phenolic hydroxyl groups per molecule exceeds 10, the effect of improving development latitude is lost. If the ratio of the number of phenolic hydroxyl groups to the number of aromatic rings is lower than 0.5, too large a film thickness dependence and a narrowed development latitude tend to result. If it exceeds 1.4, the composition has impaired stability and it is difficult to obtain high resolving power and a satisfactory film thickness dependence.

The addition amount of such a phenolic compound is preferably from 2 to 50% by weight, more preferably from 5 to 30% by weight, based on the amount of the alkali-soluble resin. If the added amount thereof exceeds 50% by weight, there is a possibility of causing deterioraion in terms of development residue or a new drawback that pattern deformation occurs during development.

Such phenolic compounds having a molecular weight of 1,000 or lower can be easily synthesized by persons skilled in the art by reference to the methods described in, e.g., JP-A-4-122938, JP-A-2-28531, U.S. Pat. No. 4,916,210, and European Patent 219,294.

Examples of the phenolic compounds are given below, but the phenolic compounds usable in the present invention should not be construed as being limited thereto.

The examples thereof include resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensation resins, phloroglucide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl)methane, 1,1-bis(4-hydroxyphenyl) cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane, and α,α,α',α'-tetrakis(4-hydroxyphenyl)-p-xylene.

Desirable organic basic compounds usable in the present invention are compounds which are more strongly basic than phenol, in particular, nitrogen-containing basic compounds.

Preferred chemical environments include structures represented by the following formulae (A) to (E).

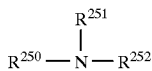

(A)

In formula (A), $R^{250}$, $R^{251}$, and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, provided that $R^{254}$ and $R^{255}$ may be bonded to each other to form a ring.

(B)

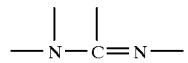

(C)

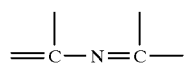

(D)

(E)

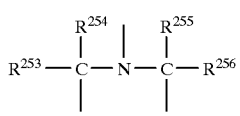

(In formula (E), $R^{253}$, $R^{254}$, $R^{255}$, and $R^{256}$ may be the same or different and each represents an alkyl group having 1 to 6 carbon atoms.)

Preferred organic basic compounds are nitrogen-containing basic compounds having, per molecule, two or more nitrogen atoms having different chemical environments. Especially preferred are compounds containing both at least one substituted or unsubstituted amino group and at least one nitrogen-containing ring structure and compounds having at least one alkylamino group. Examples of such preferred compounds include substituted or unsubstituted guanidine, substituted or unsubstituted aminopyridine, substituted or unsubstituted aminoalkylpyridines, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents include amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano. Specific examples of especially preferred organic basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the organic basic compounds usable in the present invention should not be construed as being limited to these examples.

Those nitrogen-containing basic compounds may be used alone or in combination of two or more thereof. The use amount of the nitrogen-containing basic compounds is usually from 0.001 to 10 parts by weight, preferably from 0.01 to 5 parts by weight, per 100 parts by weight of the photosensitive resin composition (excluding the solvent). If the amount thereof is smaller than 0.001 part by weight, the effects of the present invention cannot be obtained. On the other hand, if it exceeds 10 parts by weight, reduced sensitivity and impaired developability at unexposed parts are liable to be caused.

Dyes suitable for use in the present invention are oil-soluble dyes and basic dyes. Examples thereof include Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industries Ltd., Japan), crystal violet (CI 42555), methyl violet (CI 42535), rhodamine B (CI 45170B), malachite green (CI 42000), and methylene blue (CI 52015).

Spectral sensitizers such as those given below may be further added to sensitize the photo-acid generator used so as to exhibit absorption in a region of longer wavelengths than far ultraviolet, whereby the photosensitive composition of the present invention can be rendered sensitive to an i- or g-line. Examples of spectral sensitizers suitable for use in the present invention include benzophenone, p,p'-tetramethyldiaminobenzophendne, p,p'-tetraethylethylaminobenzophenone, 2-chlorothioxanthone, anthrone, 9-ethoxyanthracene, anthracene, pyrene, perylene, phenothiazine, benzil, acridine orange, benzoflavin, cetoflavin T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tertbutylanthraquinone, 1,2-benzanthraquinone, 3-methyl-1,3-diaza-1,9-benzanthrone, dibenzalacetone, 1,2-naphthoquinone, 3,3'-carbonylbis(5,7-dimethoxycarbonylcoumarin), and coronene. However, the spectral sensitizers usable in the present invention should not be construed as being limited to these examples.

Those spectral sensitizers can be used also as light absorbers for absorbing the far ultraviolet emitted by a light source. In this case, the light absorber reduces light reflection from the substrate and lessens the influence of multiple reflection within the resist film, thereby producing the effect of diminishing standing wave marks.

For application to a substrate, the photosensitive composition of the present invention is used in the form of a solution in a solvent in which the ingredients described above dissolve. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents may be used alone or as a mixture thereof.

A surfactant can be added to the solvent. Examples of the surfactant include nonionic surfactants such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylaryl ethers, e.g., polyoxyethylene octylphenol ether and polyoxyethylene nonylphenol ether, polyoxyethylene/polyoxypropylene block copolymers, sorbitan/fatty acid esters, e.g., sorbitan monolaurate, sorbitan monopalmitate, sorbitan monostearate, sorbitan monooleate, sorbitan trioleate, and sorbitan tristearate, and polyoxyethylene-sorbitan/fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as F-Top EF301, EF303, and EF352 (manufactured by New Akita Chemical Company, Japan), Megafac F171 and F173 (manufactured by Dainippon Ink & Chemicals, Inc., Japan), Fluorad FC430 and FC431 (manufactured by Sumitomo 3M Ltd., Japan), Asahi Guard AG710 and Surflon S-382, SC101, SC102, SC103, SC104, SC105, and SC106 (manufactured by Asahi Glass Co., Ltd., Japan); organosiloxane polymer KP341 (manufactured by Shin-Etsu Chemical Co., Ltd., Japan); and acrylic or methacrylic (co)polymers Polyflow No. 75 and No. 95 (manufactured by Kyoeisha Chemical Co., Ltd., Japan). The added amount of the surfactant is usually 2 parts by weight or smaller, desirably 1 part by weight or smaller, per 100 parts by weight of the solid components of the composition of the present invention.

The surfactant may be added alone or in combination of two or more thereof.

A satisfactory resist pattern can be obtained by applying the photosensitive composition described above on a substrate such as those for use in the production of precision integrated-circuit elements (e.g., silicon/silicon dioxide coating) by an appropriate coating means, e.g., a spinner or coater, exposing the coating to light through a mask, and then baking and developing the coating.

As a developing solution for the photosensitive composition of the present invention, use can be made of an alkaline aqueous solution of an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide or tetraethylammonium hydroxide, a cyclic amine, e.g., pyrrole or piperidine, or the like.

The alkaline aqueous solution for use as a developing solution may contain an appropriate amount of an alcohol and a surfactant.

The present invention will be explained below in more detail by reference to Examples, but the invention should not be construed as being limited thereto.

SYNTHESIS EXAMPLE 1

Into 200 ml of ion-exchanged water was dissolved 19.9 g (0.030 mol) of a 45% aqueous solution of triphenylsulfonium chloride. 200 ml of ion-exchanged water containing 6.2 g (0.030 mol) of sodium 4-styrenesulfonate was added thereto with stirring at room temperature. The resulting viscous solid precipitate was separated by decantation and then washed with 1 L of ion-exchanged water. The viscous solid obtained was dried at 50° C. under vacuum. As a result, 10.4 g of a vitreous solid was obtained. The NMR spectrometry measurement proved that the solid was monomer (V-1) of the present invention.

SYNTHESIS EXAMPLE 2

The same procedure as in Synthesis Example 1 was conducted, except that 7.9 g (0.030 mol) of sodium N-methacryloylsulfanilate was used in place of 6.2 g (0.030 mol) of sodium 4-styrenesulfonate. Thus, 12.8 g of a vitreous solid was obtained. The NMR spectrometry measurement proved that the solid was monomer (VII-6) of the present invention.

SYNTHESIS EXAMPLE 3

Into 200 ml of ion-exchanged water was dissolved 9.5 g (0.030 mol) of diphenyliodonium chloride. 200 ml of ion-exchanged water containing 6.2 g (0.030 mol) of sodium 4-styrenesulfonate was added thereto with stirring at room temperature. The resulting viscous solid precipitate was separated by decantation and then washed with 1 liter of ion-exchanged water. The viscous solid obtained was dried at 50° C. under vacuum. As a result, 10.2 g of a vitreous solid was obtained. The NMR spectrometry measurement proved that the solid was monomer (VI-1) of the present invention.

SYNTHESIS EXAMPLE 4

Into 400 ml of ion-exchanged water was dissolved 12.9 g (0.030 mol) of 4,4'-bis(t-butylphenyl)iodonium chloride. 200 ml of ion-exchanged water containing 7.9 g (0.030 mol) of sodium N-methacryloylsulfanilate was added thereto with stirring at room temperature. The resulting viscous solid precipitate was separated by decantation and then washed with 1 liter of ion-exchanged water. The solid obtained was dried at 50° C. under vacuum. As a result, 14.5 g of a powder was obtained. The NMR spectrometry measurement proved that the solid was monomer (VIII-8) of the present invention.

Other sulfonium and iodonium salt monomers as starting materials for resins to be used in the present invention were synthesized in the same manner.

SYNTHESIS EXAMPLE 5

The following compounds were dissolved in 30 ml of 1-methoxy-2-propanol.

| | |
|---|---|
| Monomer (V-1) obtained in Synthesis Example 1 | 8.93 g (0.020 mol) |
| Methacrylic acid | 1.72 g (0.020 mol) |

To this solution was added 50 mg of 2,2'-azobis(2,4-dimethylvaleronitrile) (manufactured by Wako Pure Chemical Industries, Ltd., Japan; trade name, V-65) as a polymerization initiator with stirring at 70° C. in a nitrogen stream. At 2 hours and at 4 hours after initiation of the reaction, the same initiator was further added in an amount of 50 mg for each addition. After the reaction was further continued for 3 hours, the reaction mixture was heated to 90° C. and continuously stirred for 1 hour. Thereafter, the reaction mixture was allowed to cool and then poured into 200 ml of ion-exchanged water to precipitate a polymer. The polymer obtained was dried at 40° C. under vacuum. Thus, 9.5 g of resin (I-1) according to the present invention was obtained. The molecular weight thereof was measured by GPC (gel permeation chromathograhy), and was found to be $22.5 \times 10^3$ in terms of weight-average molecular weight (reduced to polystyrene).

SYNTHESIS EXAMPLE 6

The following compounds were dissolved in 30 ml of 1-methoxy-2-propanol.

| | |
|---|---|
| Monomer (VIII-8) obtained in Synthesis Example 4 | 12.67 g (0.020 mol) |
| 4-Carboxystyrene | 2.96 g (0.020 mol) |

This solution was reacted and post-treated in the same manner as in Synthesis Example 5. Thus, 13.5 g of resin (IV-4) according to the present invention was obtained. The molecular weight thereof was measured by GPC, and was found to be $18.5 \times 10^3$ in terms of weight-average molecular weight (reduced to polystyrene).

SYNTHESIS EXAMPLE 7

The following compounds were dissolved in 30 ml of DMF.

| | |
|---|---|
| 2-(N-Acryloyl)amino-2-methylpropanesulfonic acid | 2.46 g (0.012 mol) |
| Methacrylic acid | 1.38 g (0.016 mol) |
| Benzyl methacrylate | 2.82 g (0.016 mol) |

To this solution was added 50 mg of 2,2'-azobis(2,4-dimethylvaleronitrile) (manufactured by Wako Pure Chemical Industries, Ltd.; trade name, V-65) as a polymerization initiator with stirring at 70° C. in a nitrogen stream. At 2 hours and at 4 hours after initiation of the reaction, the same initiator was further added in an amount of 50 mg for each addition. After the reaction was further continued for 3 hours, the reaction mixture was heated to 90° C. and continuously stirred for 1 hour. Thereafter, the reaction mixture was allowed to cool and then poured into 200 ml of ion-exchanged water to precipitate a polymer. The polymer obtained was dried at 40° C. under vacuum. Thus, 5.9 g of a terpolymer was obtained. This polymer was dissolved in 100 ml of ion-exchanged water containing 0.43 g of sodium hydroxide. 100 ml of ion-exchanged water containing 7.3 g (0.011 mol) of 45% aqueous solution of triphenylsulfonium chloride was added with stirring at room temperature. The resulting viscous resin was dried at 50° C. under vacuum. As a result, 7.8 g of a vitreous resin (resin (III-1) according to the present invention) was obtained. The molecular weight thereof was measured by GPC, and was found to be $37.4 \times 10^3$ in terms of weight-average molecular weight (reduced to polystyrene).

Other resins of the present invention which are shown in Table 1 were synthesized in the same manner.

EXPERIMENT

The resins according to the present invention obtained by the methods shown in the above Synthesis Examples were examined for solubility in the solvents specified below. The results obtained are shown in Table 2 together with the results obtained with comparative compounds.

In the solubility test, 0.2 g of each resin according to the present invention was added to 10 ml of each solvent and the degree of dissolution was visually evaluated.

TABLE 2

Solubility in Solvents

| Compound according to the Invention | Acetone | PGMEA | EL/EEP (7/3) |
|---|---|---|---|
| Compound (I-2) | A | A | A |
| Compound (I-3) | A | A | A |
| Compound (I-4) | A | A | A |
| Compound (II-3) | A | A | A |
| Compound (II-4) | A | A | A |
| Compound (II-5) | A | A | A |
| Compound (III-1) | A | A | A |
| Compound (III-6) | A | A | A |
| Compound (IV-1) | A | A | A |
| Compound (IV-3) | A | A | A |
| Comparative Compound (A) | B | C | C |
| Comparative Compound (B) | B | C | C |

Symbols in the Table
A: dissolved
B: partly dissolved
C: undissolved
Solvents Used
PGMEA: propylene glycol monomethyl ether acetate
EL: ethyl lactate
EEP: ethyl 3-ethoxypropionate
Comparative Compounds
(A): triphenylsulfonium p-toluenesulfonate
(B): diphenyliodonium p-toluenesulfonate The results given in Table 2 show that the photo-acid generators according to the present invention had excellent solubility in the solvents.

EXAMPLES 1 TO 15 AND COMPARATIVE EXAMPLES 1 TO 3

Resists were prepared using the compounds according to the present invention which were shown in the Synthesis Examples given above. The formulations used are shown in Table 3.

TABLE 3

Formulations for Photosensitive Compositions

| | Photo-acid Generator (g) | Resin (g) | Additive (dissolution inhibitive compound, alkali-soluble resin) | Acid-decomposable Group |
|---|---|---|---|---|
| Example 1 | Compound (I-7) 0.20 g | PHS/EES 1.90 g | — | — |
| Example 2 | Compound (II-3) 0.20 g | PHS/EES 1.90 g | — | — |
| Example 3 | Compound (I-2) 0.20 g | PHS/THPS 1.90 g | — | — |
| Example 4 | Compound (IV-2) 0.20 g | PHS/THPS 1.90 g | — | — |
| Example 5 | Compound (I-2) 0.20 g | PHS/BES 1.90 g | — | — |
| Example 6 | Compound (IV-3) 0.20 g | PHS/BES 1.90 g | — | — |
| Example 7 | Compound (I-1) 0.20 g | PHS/TBOMS 1.60 g | Dissolution Inhibitive Compound (7) 0.30 g | TBE |
| Example 8 | Compound (I-3) 0.20 g | PHS/THPS 1.60 g | Dissolution Inhibitive Compound (16) 0.30 g | TBE |
| Example 9 | Compound (III-1) 0.20 g | PHS/EES 1.60 g | Dissolution Inhibitive Compound (31) 0.30 g | TBOC |
| Example 10 | Compound (II-4) 0.20 g | PHS/TBOMS 1.60 g | Dissolution Inhibitive Compound (18) 0.30 g | THP |
| Example 11 | Compound (IV-1) 0.20 g | PHS/TBOMS 1.60 g | Dissolution Inhibitive Compound (41) 0.30 g | EE |
| Example 12 | Compound (III-4) 0.20 g | PHS/THPS 1.20 g | Dissolution Inhibitive Compound (18) 0.30 g PHS/AcST 0.40 g | THP |
| Example 13 | Compound (I-4) 0.20 g | — | Dissolution Inhibitive Compound (60) 0.50 g PHS/St 0.40 g | TBE |
| Example 14 | Compound (III-6) 0.20 g | — | Dissolution Inhibitive Compound (60) 0.50 g PHS/St 1.40 g | THP |
| Example 15 | Compound (IV-4) 0.20 g | — | Dissolution Inhibitive Compound (60) 0.50 g PHS/OHS 1.40 g | TBE |
| Comparative Example 1 | Comparative Compound (C) 0.10 g | PHS/EES 1.90 g | — | — |
| Comparative Example 2 | Comparative Compound (C) 0.10 g | PHS/THPS 1.60 g | Dissolution Inhibitive Compound (16) 0.30 g | TBE |
| Comparative Example 3 | Comparative Compound (C) 0.10 g | — | Dissolution Inhibitive Compound (62) 0.50 g PHS/St 1.40 g | THP |

The abbreviations used in Table 3 have the following meanings.

Polymers

The ratios given in parentheses are by mole.

PHS/EES
 p-hydroxystyrene/p-(1-ethoxyethoxy)styrene copolymer (70/30) (weight-average molecular weight, 21,000)

PHS/BES
 p-hydroxystyrene/p-(1-t-butoxyethoxy) styrenecopolymer (70/30) (weight-average molecular weight, 22,000)

PHS/TBOMS
 p-hydroxystyrene/t-butoxycarbonylmethyloxystyrene copolymer (80/20) (weight-average molecular weight, 20,000)

PHS/THPS
 p-hydroxystyrene/p-(2-tetrahydropyranyloxy)styrene copolymer (70/30) (weight-average molecular weight, 22,000)

PHS/St
 p-hydroxystyrene/styrene copolymer (85/15) (weight-average molecular weight, 35,000)

PHS/AcST
 p-hydroxystyrene/p-acetoxystyrene copolymer (80/20) (weight-average molecular weight, 20,000)

PHS/OHS
 p-hydroxystyrene/o-hydroxystyrene copolymer (80/20) (weight-average molecular weight, 32,000)

Acid-decomposable Groups in Dissolution Inhibitive Agents
 TBOC: —O—CO—$C_4H_9^t$
 TBE: —O—$CH_2$—COO—$C_4H_9^t$

THP:

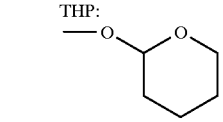

EE:

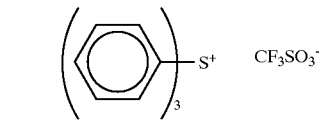

Comparative Compound (C)

(triphenylsulfonium trifluoromethanesulfonate)

Preparation and Evaluation of Photosensitive Compositions

To each mixture shown in Table 3 was added 0.02 g of 4-dimethylaminopyridine. The resulting mixture was dissolved into 9.5 g of propylene glycol monomethyl ether acetate, and this solution was filtered through a 0.2 μm filter to prepare a resist solution. Each resist solution was applied to a silicon wafer with a spin coater, and the coating was dried at 110° C. for 90 seconds with a vacuum suction type hot plate to obtain a resist film having a thickness of 0.83 μm.

These resist films were exposed to light using a 248 nm KrF excimer laser stepper (NA=0.42). Immediately after the exposure, the resist films each was heated with a 100° C. vacuum suction type hot plate for 60 seconds, subsequently immersed for 60 seconds in a 2.38% aqueous solution of tetramethylammonium hydroxide (TMAH), rinsed with water for 30 seconds, and then dried. The thus-obtained resist patterns on silicon wafers were evaluated for profile, sensitivity, and resolving power by the following methods and compared. The results obtained are shown in Table 4.

Profile

The thus-obtained resist patterns on silicon wafers were examined with a scanning electron microscope to evaluate the profile of each pattern.

Sensitivity

Sensitivity is expressed in terms of the exposure energy necessary for reproducing a 0.40 μm mask pattern.

Resolving Power

Resolving power is expressed in terms of threshold resolution at the exposure energy necessary for reproducing a 0.40 μm mask pattern.

Difference in Line Width Caused by the Lapse of Time after Exposure

Further, after exposure was conducted in the same manner as described above, the resist films were allowed to stand for 2 hours and then heated in the same manner. Immediately thereafter, the resist films were immersed for 60 seconds in a 2.38% aqueous solution of tetramethylammonium hydroxide (TMAH), rinsed with water for 30 seconds, and then dried. The line width of each of the thus-obtained 0.35 μm mask patterns was measured, and the difference between this found value and that of the corresponding mask pattern obtained through heating immediately after exposure was calculated. The results obtained are shown in Table 4.

TABLE 4

Results of Evaluation

| | Sensitivity (mJ/cm$^2$) | Resolving Power (μm) | Profile of Resist Pattern | Line width difference between heating immediately after exposure and heating at 2 hr after exposure |
|---|---|---|---|---|
| Example 1 | 23 | 0.28 | rectangular | A |
| Example 2 | 23 | 0.29 | rectangular | A |
| Example 3 | 22 | 0.29 | rectangular | A |
| Example 4 | 24 | 0.29 | rectangular | A |
| Example 5 | 22 | 0.29 | rectangular | A |
| Example 6 | 24 | 0.29 | rectangular | A |
| Example 7 | 21 | 0.28 | rectangular | A |
| Example 8 | 22 | 0.29 | rectangular | A |
| Example 9 | 23 | 0.30 | rectangular | A |
| Example 10 | 22 | 0.28 | rectangular | A |
| Example 11 | 23 | 0.29 | rectangular | A |
| Example 12 | 22 | 0.30 | rectangular | A |
| Example 13 | 21 | 0.29 | rectangular | A |
| Example 14 | 23 | 0.30 | rectangular | A |
| Example 15 | 23 | 0.29 | rectangular | A |
| Comparative Example 1 | 24 | 0.30 | rectangular | C |
| Comparative Example 2 | 23 | 0.30 | rectangular | C |
| Comparative Example 3 | 23 | 0.30 | rectangular | C |

Symbols in the Table (line width difference: decrease)
A: 0–7%
B: 8–14%
C: ≧15%

The results given in Table 4 show that the resists according to the present invention were positive photosensitive compositions which gave a resist pattern having a satisfactory profile, had high sensitivity and high resolving power, and were reduced in line width change with the lapse of time after exposure as compared with the resists of Comparative Examples 1 to 3.

As demonstrated above, the photosensitive compositions provided by the present invention have good solubility in solvents, give a resist pattern having a satisfactory profile, have high sensitivity and high resolving power, and suffer little performance change with the lapse of time after exposure.

While the invention has been described in detail and with reference to specific embodiments thereof, it will be apparent to one skilled in the art that various changes and modifications can be made therein without departing from the spirit and scope thereof.

What is claimed is:

1. A photosensitive composition containing a sulfonium salt resin having at least one kind of repeating structural units represented by formulae (I) or (III):

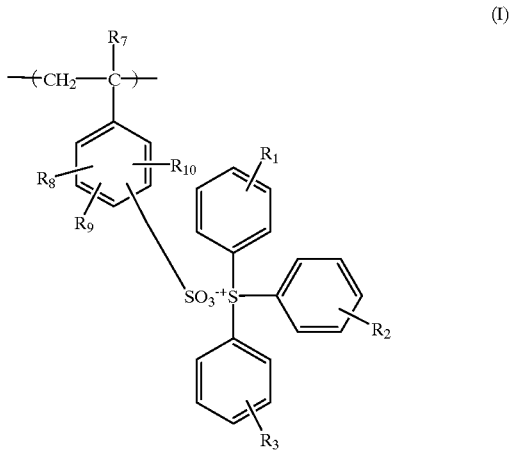

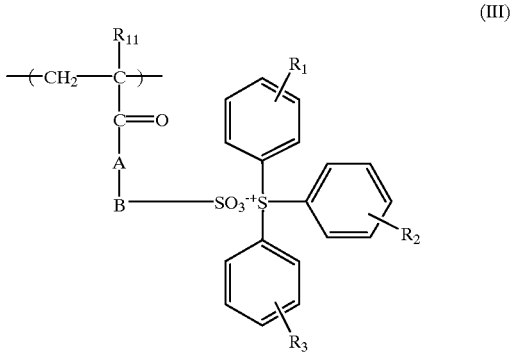

wherein $R_1$ to $R_3$ each independently represents a hydrogen atom, a hydroxy group, a halogen atom, an alkyl group which may have substituent(s), a cycloalkyl group which may have substituent(s), an alkoxy group which may have substituent(s), or a group represented by —S—$R_6$, wherein $R_6$ represents an alkyl group which may have substituent(s) or an aryl group which may have substituent(s); $R_7$ and $R_{11}$, each independently represents a hydrogen atom, a halogen atom, a cyano group, or an alkyl group which may have substituent(s); $R_8$ to $R_{10}$ each independently represents a hydrogen atom, a hydroxy group, a halogen atom, a nitro group, a carboxyl group, an alkyl group which may have substituent(s), an aralkyl group which may have substituent (s) or an alkoxy group which may have substituent(s); A represents —O— or a group represented by —N$R_{12}$—, wherein $R_{12}$ represents a hydrogen atom or an alkyl group which may have substituent(s) or an aryl group which may have substituent(s); and B represents an alkylene group which may have substituent(s) or an arylene group which may have substituent(s).

2. The photosensitive composition of claim 1, wherein the repeating structural unit is represented by formula (I).

3. The photosensitive composition of claim 1, wherein the repeating structural unit is represented by formula (III).

4. A positive photosensitive composition comprising
(1) a resin having groups which decompose by the action of an acid to enhance solubility of the resin in an alkaline developing solution and
(2) a resin which generates a sulfonic acid upon irradiation with actinic rays or a radiation and has at least one kind of repeating structural units represented by formulae (I) or (III):

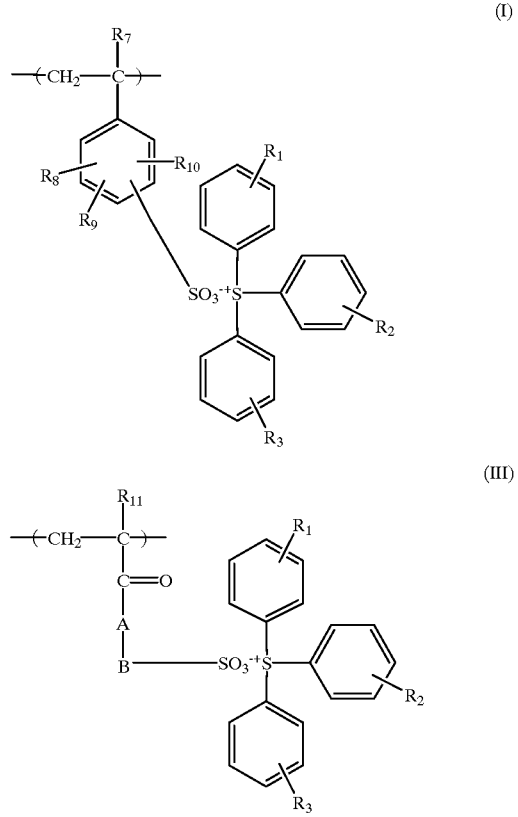

wherein $R_1$ to $R_3$ each independently represents a hydrogen atom, a hydroxy group, a halogen atom, an alkyl group which may have substituents(s), a cycloalkyl group which may have substituent(s), an alkoxy group which may have substituent(s), or a group represented by —S—$R_6$, wherein $R_6$ represents an alkyl group which may have substituent(s) or an aryl group which may have substituent(s); $R_7$ and $R_{11}$ each independently represents a hydrogen atom, a halogen atom, a cyano group, or an alkyl group which may have substituent(s); $R_8$ to $R_{10}$ each independently represents a hydrogen atom, a hydroxy group, a halogen atom, a nitro group, a carboxyl group, an alkyl group which may have substituent(s), an aralkyl group which may have substituent(s) or an alkoxy group which may have substituent(s); A represents —O— or a group represented by —$NR_{12}$—, wherein $R_{12}$ represents a hydrogen atom or an aryl group which may have substituent(s) or an aryl group which may have substituent(s); and B represents an alkylene group which may have substituent(s) or an arylene group which may have substituent(s).

5. The positive photosensitive composition of claim 4, which further contains a low-molecular acid-decomposable dissolution inhibitive compound having a molecular weight of 3,000 or lower and having groups decomposable by an acid, which enhances solubility of the dissolution inhibitive compound in an alkaline developing solution by the action of an acid.

6. The positive photosensitive composition of claim 5, which further contains a resin insoluble in water and soluble in an aqueous alkali solution.

7. The positive photosensitive composition of claim 4, which further contains a resin insoluble in water and soluble in an aqueous alkali solution.

8. The positive photosensitive composition of claim 4, wherein the repeating structural unit is represented by formula (I).

9. The positive photosensitive composition of claim 4, wherein the repeating structural unit is represented by formula (III).

10. A positive photosensitive composition comprising:
a resin which generates a sulfonic acid upon irradiation with actinic rays or a radiation and has at least one kind of repeating structural units represented by formulae (I) or (III):

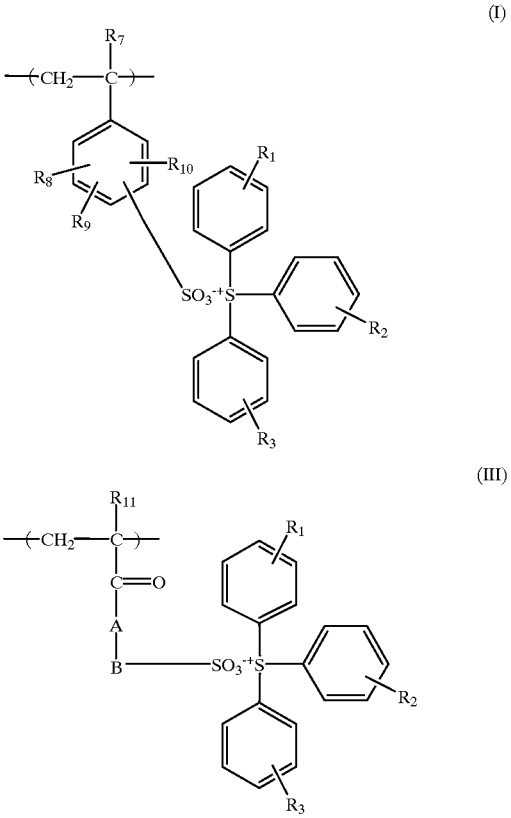

wherein $R_1$ to $R_3$ each independently represents a hydrogen atom, a hydroxy group, a halogen atom, an alkyl group which may have substituent(s), a cycloalkyl group which may have substituent(s), an alkoxy group which may have substituent(s), or a group represented by —S—$R_6$, wherein $R_6$ represents an alkvl group which may have substituent(s) or an aryl group which may have substituent(s); $R_7$ and $R_{11}$ each independently represents a hydrogen atom, a halogen atom, a cyano group, or an alkyl group which may have substituent(s); $R_8$ to $R_{10}$ each independently represents a hydrogen atom, a hydroxy group, a halogen atom, a nitro group a carboxyl group, an alkyl group which may have substituent(s), an aralkyl group which may have substituent(s) or an alkoxy group which may have substituent(s); A represents —O— or a group represented by —$NR_{12}$—, wherein $R_{12}$ represents a hydrogen atom or an alkyl group which may have substituent(s) or an aryl group which may have substituent(s); and B represents an alkylene group which may have substituent(s) or an arylene group which may have substituent(s);

a low-molecular acid-decomposable dissolution inhibitive compound having a molecular weight of 3,000 or lower and having groups decomposable by an acid, which enhances solubility of the dissolution inhibitive compound in an alkaline developing solution by the action of an acid; and a resin insoluble in water and soluble in an aqueous alkali solution.

11. The positive photosensitive composition of claim 10, wherein the repeating structural unit is represented by formula (I).

12. The positive photosensitive composition of claim 10, wherein the repeating structural unit is represented by formula (III).

* * * * *